United States Patent
Roan et al.

(10) Patent No.: US 10,278,305 B2
(45) Date of Patent: Apr. 30, 2019

(54) ELECTRONIC ASSEMBLY WITH PHASE-CHANGE COOLING OF A SEMICONDUCTOR DEVICE

(71) Applicant: Deere & Company, Moline, IL (US)

(72) Inventors: Thomas J. Roan, Fargo, ND (US); Brij N. Singh, West Fargo, ND (US)

(73) Assignee: DEERE & COMPANY, Moline, IL (US)

(*) Notice: Subject to any disclaimer, the term of this patent is extended or adjusted under 35 U.S.C. 154(b) by 0 days.

(21) Appl. No.: 15/722,394

(22) Filed: Oct. 2, 2017

(65) Prior Publication Data

US 2018/0279508 A1 Sep. 27, 2018

Related U.S. Application Data

(60) Provisional application No. 62/476,642, filed on Mar. 24, 2017.

(51) Int. Cl.
| | |
|---|---|
| *H05K 7/20* | (2006.01) |
| *H01L 23/24* | (2006.01) |
| *H01L 23/367* | (2006.01) |
| *H01L 23/473* | (2006.01) |
| *H01L 21/48* | (2006.01) |
| *H01L 23/373* | (2006.01) |
| *H05K 1/02* | (2006.01) |
| *H01L 23/00* | (2006.01) |

(52) U.S. Cl.
CPC ..... *H05K 7/20254* (2013.01); *H01L 21/4871* (2013.01); *H01L 23/24* (2013.01); *H01L 23/367* (2013.01); *H01L 23/3736* (2013.01); *H01L 23/473* (2013.01); *H05K 1/0203* (2013.01); *H05K 7/20936* (2013.01); *H01L 24/48* (2013.01); *H01L 2224/49109* (2013.01)

(58) Field of Classification Search
CPC ............ H05K 7/20254; H01L 21/4871
USPC .................................. 361/700, 714
See application file for complete search history.

(56) References Cited

U.S. PATENT DOCUMENTS

| | | | |
|---|---|---|---|
| 7,352,585 B2 * | 4/2008 | Mandel | H01L 21/4878 165/104.33 |
| 8,812,169 B2 * | 8/2014 | Leech | G06F 1/206 165/165 |

(Continued)

FOREIGN PATENT DOCUMENTS

JP 2014074568 A 4/2014

OTHER PUBLICATIONS

Search Report issued in counterpart application No. EP 18164015.2, dated Aug. 20, 2018 (7 pages).

*Primary Examiner* — Mukundbhai G Patel

(57) ABSTRACT

An electronic assembly comprises a heat-generating semiconductor device that has a first side and a second side opposite the first side. An evaporator stack has a floor and a hollow body. The evaporator stack overlies the first side of the semiconductor device. The heated floor can convert a liquid-phase of a coolant (e.g., refrigerant) into a gas-phase of the coolant. A condensation container is in communication with the evaporator stack and is arranged to receive a gas-phase of the coolant. The condensation container is configured to convert the received gas-phase of the coolant into a liquid phase to replenish the liquid-phase coolant for interaction with the floor of the evaporator stack.

25 Claims, 18 Drawing Sheets

(56) References Cited

U.S. PATENT DOCUMENTS

| | | | |
|---|---|---|---|
| 2004/0100771 A1* | 5/2004 | Luo | F28D 15/02 |
| | | | 361/700 |
| 2005/0205239 A1 | 9/2005 | Take | |
| 2007/0159798 A1* | 7/2007 | Chen | H01L 23/4006 |
| | | | 361/700 |
| 2007/0246193 A1* | 10/2007 | Bhatti | F28D 15/0233 |
| | | | 165/104.21 |
| 2013/0320517 A1* | 12/2013 | Shirley | H01L 23/06 |
| | | | 257/704 |
| 2016/0123637 A1 | 5/2016 | Moreno et al. | |

* cited by examiner

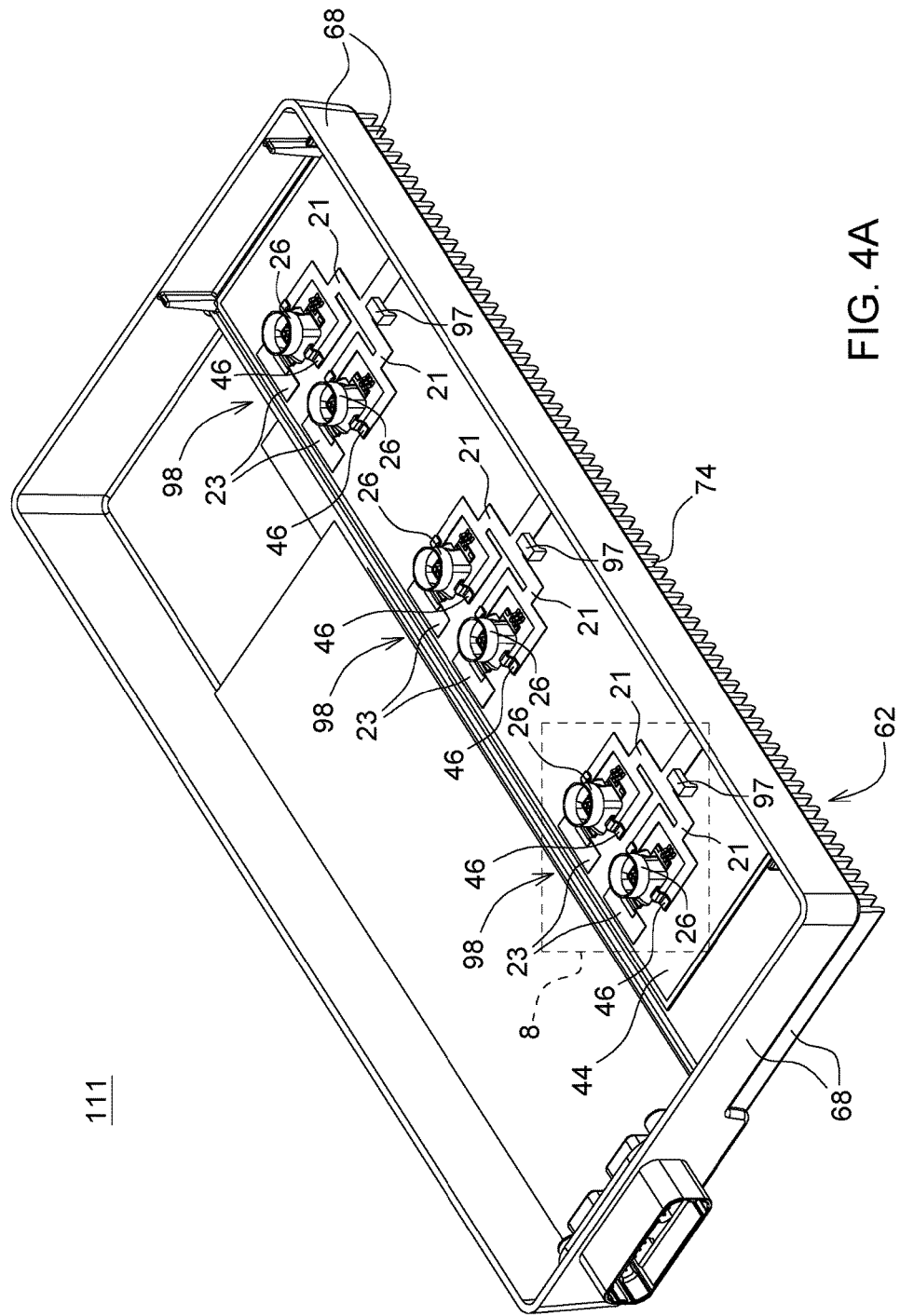

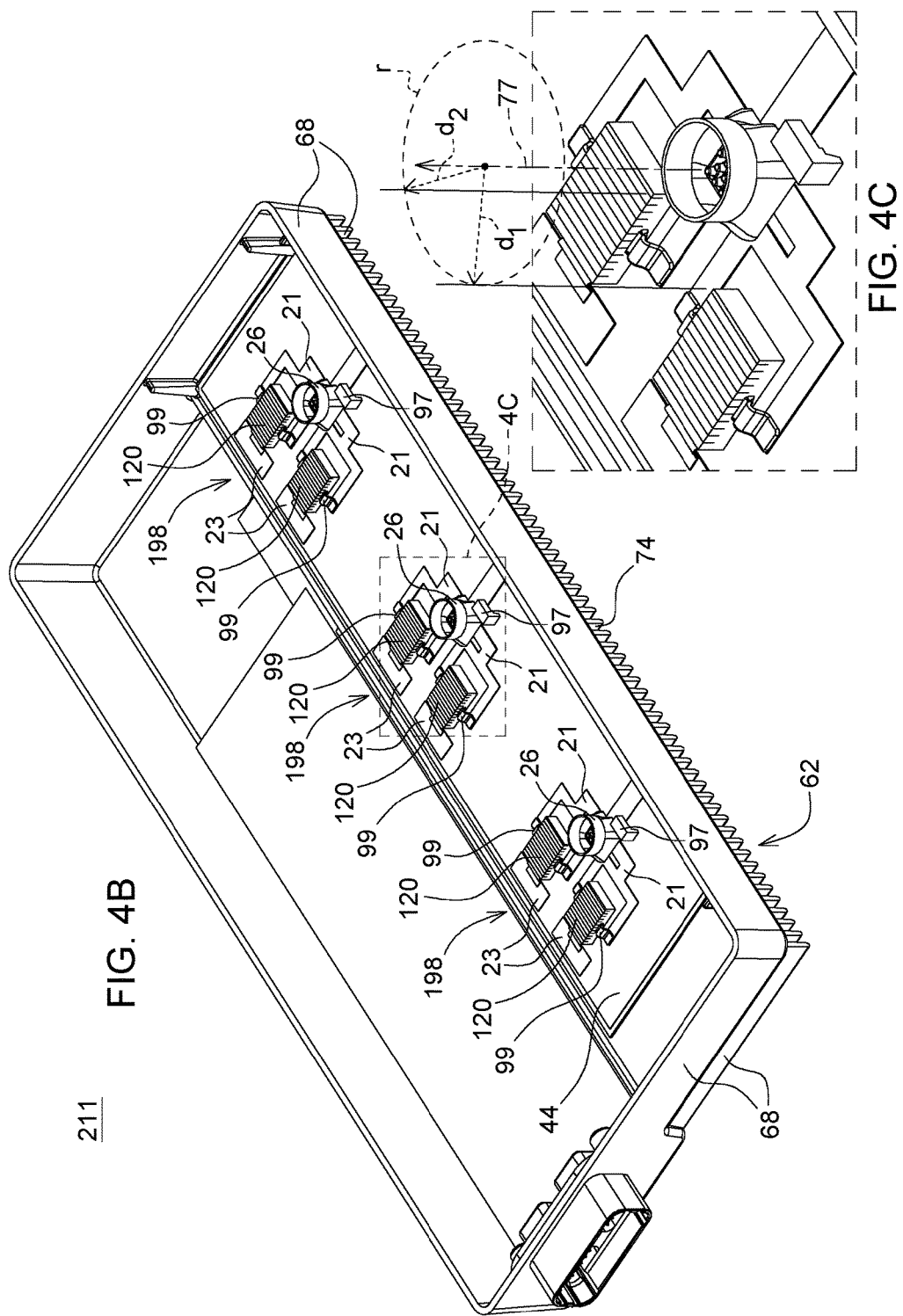

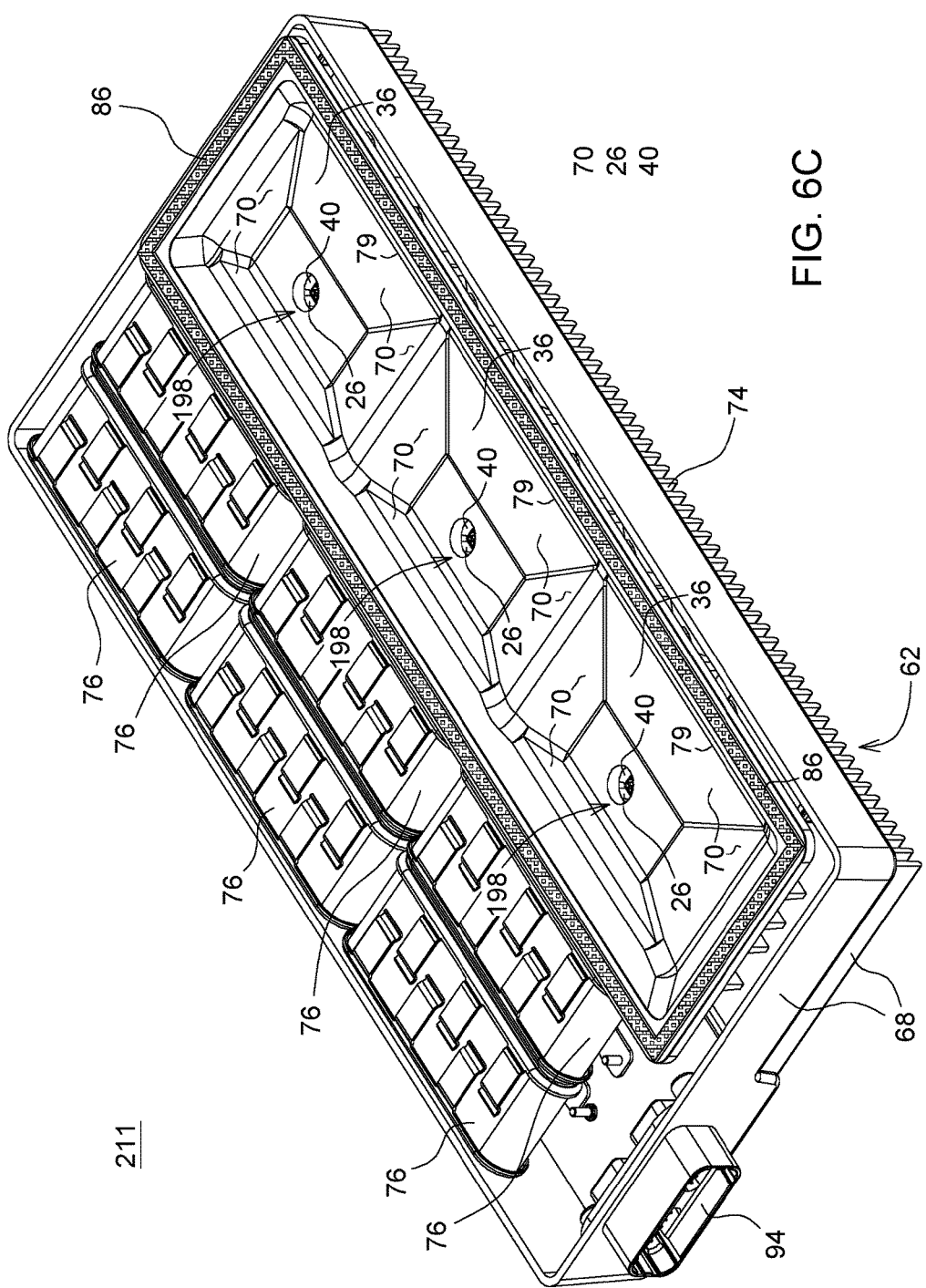

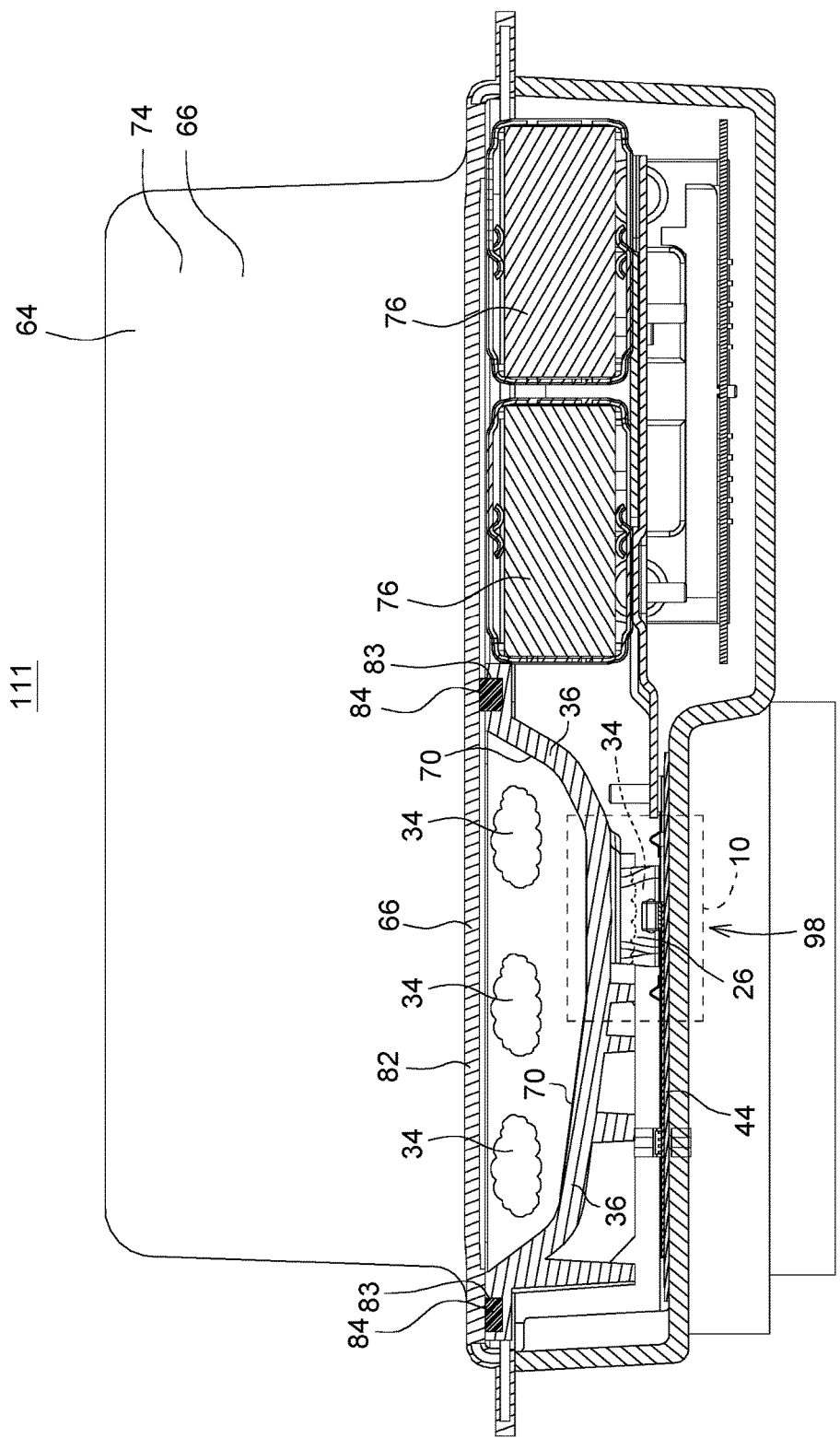

US 10,278,305 B2

ELECTRONIC ASSEMBLY WITH PHASE-CHANGE COOLING OF A SEMICONDUCTOR DEVICE

RELATED APPLICATION

This document (including the drawings) claims priority and the benefit of the filing date based on U.S. provisional application No. 62/476,642, filed Mar. 24, 2017 under 35 U.S.C. § 119 (e), where the provisional application is hereby incorporated by reference herein.

FIELD

This disclosure relates to an electronic assembly with phase-change cooling of a semiconductor device or another heat-generating component.

BACKGROUND

In a power electronics system the main heat generating components are often power semiconductor devices such as silicon insulated-gate bipolar transistors (IGBTs) or silicon carbide (SiC) metal-oxide-semiconductor field effect transistors (MOSFETs). The thermal design of the power electronics system needs to regulate appropriately the junction temperature of the power semiconductor device to achieve desired longevity and reliability.

There are generally two alternate cooling approaches: (1) air-cooled configurations and (2) liquid-cooled configurations. Because of the high heat-flux generated by power semiconductor devices, air cooling has limited capability for heat extraction. Therefore, liquid cooling is often used in the electronics system (e.g., inverter) for heavy-duty vehicles. The drawback of liquid-cooled configurations include the cost and complexity of an external pump and radiator systems to extract heat from liquid flowing through coolant channels in the electronics system. Thus, there is a need for an electronic assembly with phase-change cooling of the semiconductor device.

SUMMARY

In accordance with one embodiment, an electronic assembly comprises a heat-generating semiconductor device that has a first side and a second side opposite the first side. An evaporator stack has a floor and a hollow body. The evaporator stack overlies the first side of the semiconductor device. The heated floor can convert a liquid-phase of a coolant into a gas-phase of the coolant. A condensation container is in communication with the evaporator stack and is arranged to receive a gas-phase or vapor-phase of a coolant. The condensation container is configured to convert the received gas-phase of the coolant into a liquid phase to replenish the liquid-phase coolant for interaction with the floor of the evaporator stack.

BRIEF DESCRIPTION OF THE DRAWINGS

FIG. 4A is a perspective view of one embodiment of a circuit board in a second enclosure portion with evaporator stacks overlying corresponding semiconductor devices on the circuit board.

FIG. 4B is a perspective view of an alternate embodiment of a circuit board with evaporator stacks overlying conductive traces of the circuit board.

FIG. 4C is an enlarged view of the rectangular area labeled 4C in FIG. 4B.

FIG. 6C is a perspective view of an alternate embodiment of the second enclosure portion further comprising condensation containers above corresponding evaporator stacks of FIG. 4B.

FIG. 9A is a cross section of the electronic assembly as viewed along reference line 9-9 of FIG. 1 with seals between the first enclosure portion and the condensation containers.

In any set of two or more drawings, like reference numbers indicate like elements or features.

DETAILED DESCRIPTION

Figure 10:
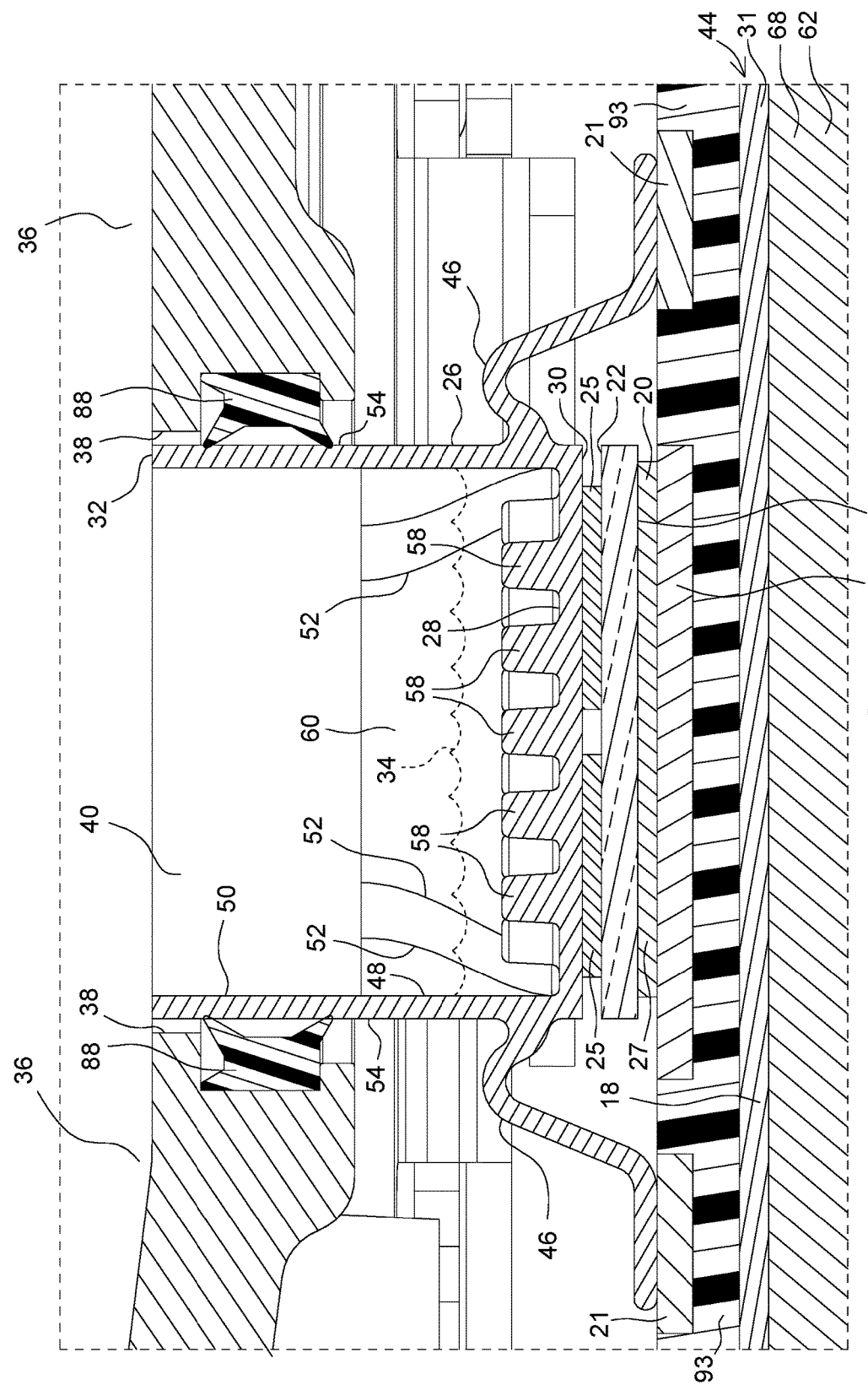
FIG. 10 is an enlarged rectangular view of a portion of the electronic assembly as indicated by the dashed rectangle 10 of FIG. 9A.

An electronic assembly (111 or 211) comprises a heat-generating semiconductor device 20 (in FIG. 10), a heat-generating component, or heat-conducting feature (e.g., metallic trace 21 in FIG. 4B near heat generating semiconductor device 120). In accordance with one embodiment, as illustrated in FIG. 10, the semiconductor device 20 has a first side 22 and a second side 24 opposite the first side 22. An evaporator stack 26 comprises a hollow body 42 with a floor 28 at a first end 30 and an outlet 40 at a second end 32 opposite the first end 30. In one embodiment, the evaporator stack 26 overlies the first side 22 of the semiconductor device 20, heat-generating component or heat-conducting feature, wherein the evaporator stack 26 or its heated floor 28 (e.g., once heated to a critical temperature by the semiconductor device 20) can convert a liquid-phase of a coolant 34 (e.g., refrigerant) into a gas-phase of the coolant 34. A condensation container 36 has an opening 38 in communication with the outlet 40 of the evaporator stack 26. The condensation container 36 is adapted to receive a gas-phase or vapor-phase of a coolant 34 and to cool or convert the received gas-phase of the coolant 34 into a liquid phase to replenish liquid-phase coolant for interaction with the floor 28 of the evaporator stack 26.

In one embodiment, the coolant 34 may comprise a refrigerant, such as R134a or R245fa, or another commercially available refrigerant.

Figure 1:
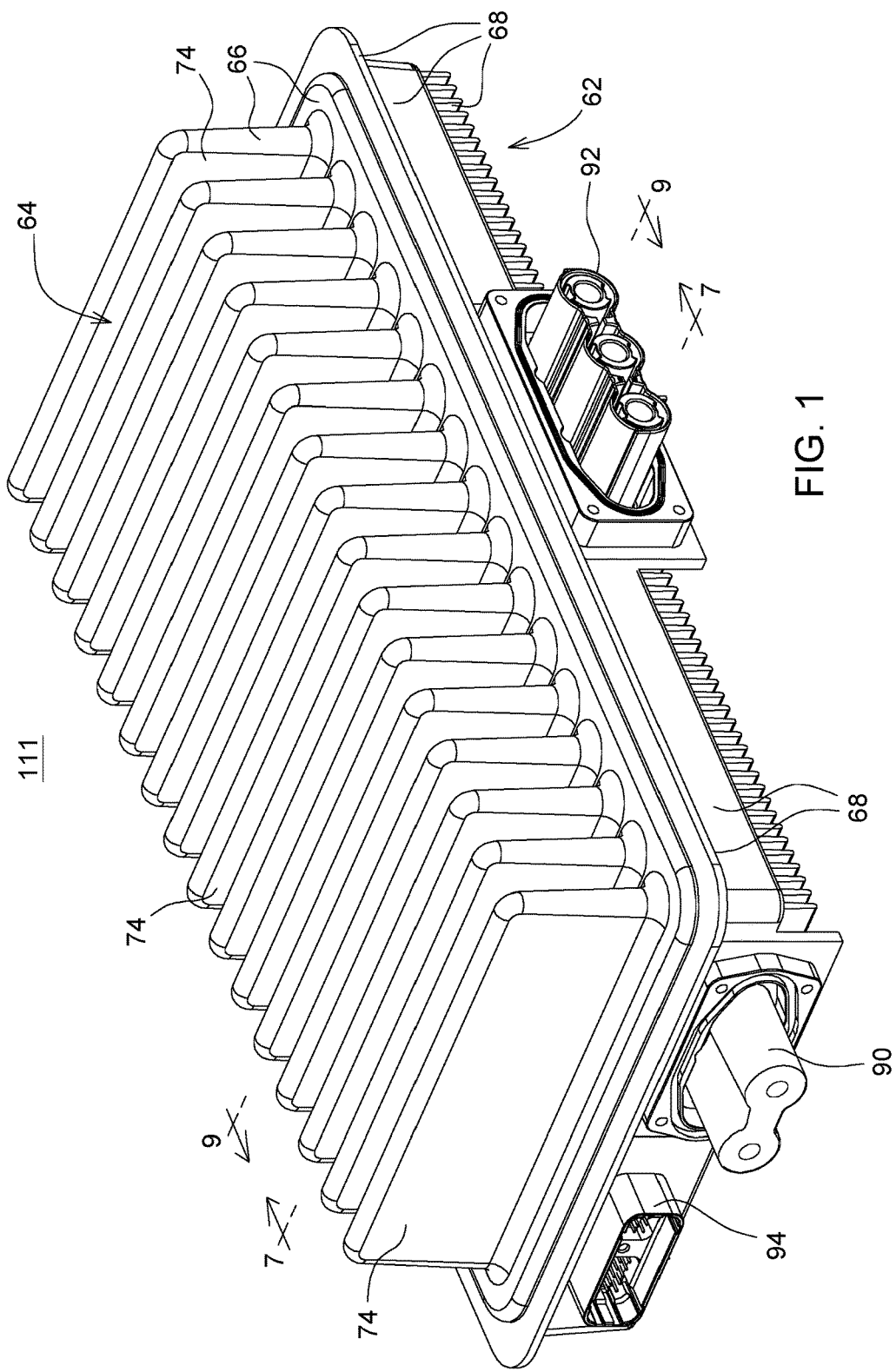
FIG. 1 is a perspective view of an upper side of one embodiment of the electronic assembly.

FIG. 1 provides a perspective view of an upper side of one embodiment of the electronic assembly 111. The electronic assembly 111 comprises an enclosure for housing a circuit board 44 (in FIG. 4A) and electronic components. As illustrated, the enclosure comprises a first enclosure portion 66 and a second enclosure portion 68. The first enclosure portion 66 and the second enclosure portion 68 may be secured or fastened together via one or more fasteners or retainers. The first enclosure portion 66 is or comprises an upper heat sink 64, whereas the second enclosure portion 68 is or comprises a lower heat sink 62. The upper heat sink 64 and the lower heat sink 62 each have fins 74 to enhance the surface area for improved thermal dissipation from one or more heat-generating elements within the enclosure or electronics assembly. Although the enclosure may comprise both a lower heat sink 62 and an upper heat sink 64, in some embodiments the enclosure or electronic assembly 111 may comprise only a lower heat sink 62 or an upper heat sink 64.

As shown in FIG. 1, the illustrative electronics assembly further comprises a direct current (DC) port 90, an alternating current (AC) port or ports 92, and a control port 94. The DC port 90 can be connected to a direct current supply of electrical energy. The AC port 92 outputs one or more alternating current output signals, such as the output phase signals of a controller or an inverter. The control port 94 may be coupled to a data bus, cable or other transmission line for communication of input and output digital signals, analog signals, or both.

Figure 2:
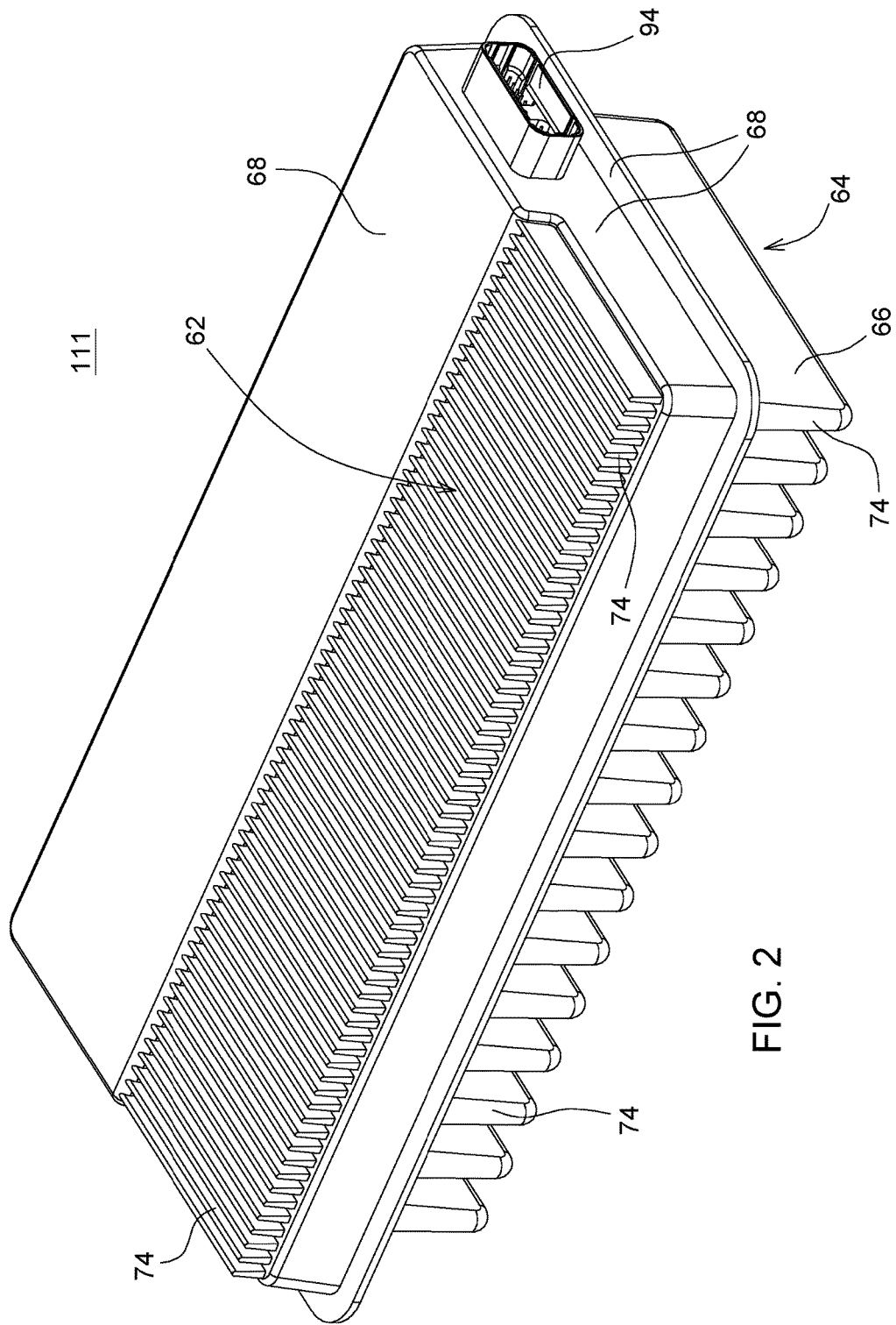
FIG. 2 is a perspective view of a lower side of the electronic assembly of FIG. 1.
Figure 3:
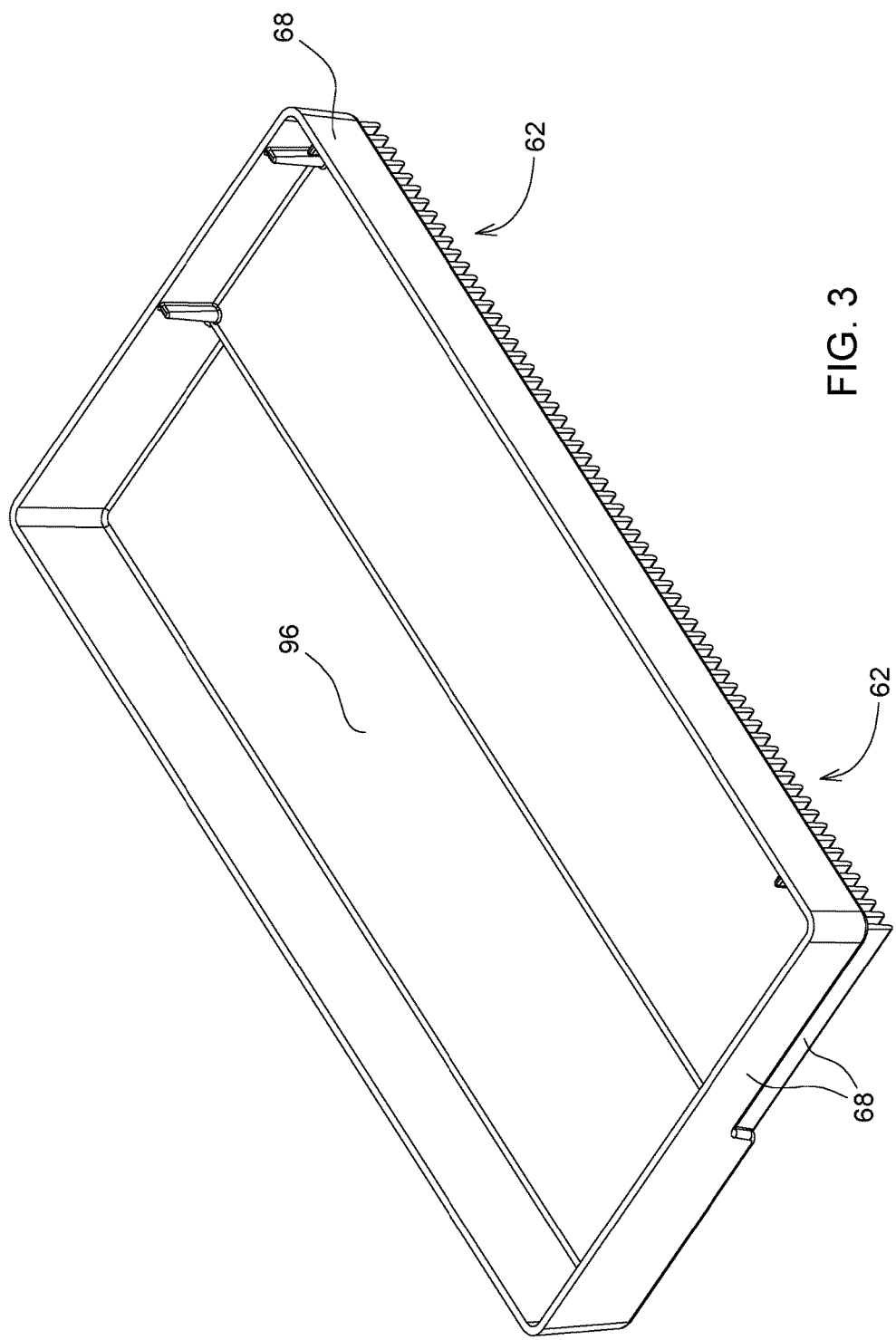
FIG. 3 is a perspective view of a second enclosure portion (e.g., lower enclosure portion) of the electronic assembly of FIG. 1 with the first enclosure portion (e.g., upper enclosure portion) removed.

FIG. 2 is a perspective view of a lower side of the electronic assembly 111 of FIG. 1. FIG. 3 is a perspective view of a second enclosure portion 68 (e.g., lower enclosure portion) of the electronic assembly 111 of FIG. 1 with the first enclosure portion 66 (e.g., upper enclosure portion) removed. The enclosure interior 96 of the second enclosure portion 68 is arranged to receive a circuit board 44 or circuit board assembly and a capacitors 76.

FIG. 4A and FIG. 4B illustrate one or more stack assemblies (98, 198) of evaporator stacks 26 mounted on a circuit board 44. In FIG. 4A, a stack assembly 98 refers to an evaporator stack 26, associated metallic traces 21 on the circuit board 44, and metal tabs 46; the stack assembly 98 can include semiconductor device 20 on which the evaporator stack 26 is mounted. Similarly, in FIG. 4B a stack assembly 98 refers to an evaporator stack 26, associated metallic traces 21 on the circuit board 44, and metal tabs 46; the stack assembly 98 can include a conductive pad 29 on which the evaporator stack 26 is mounted.

Each evaporator stack 26 overlies a heat-generating component, a semiconductor device 20, or a metallic trace 21 near or coextensive with an output terminal of the semiconductor device (20 or 120). The direct current (DC) terminals 23 provide direct current energy to the semiconductor devices 20. The evaporator stack 26 facilitates a first thermal path 78 from the heat-generating component, the heat-generating semiconductor (20 or 120), or heated metallic trace 21 to the first enclosure portion 66 or the upper heat sink 64, where the heat or thermal energy is dissipated to the ambient air or environment.

FIG. 4A is a perspective view of one embodiment of a circuit board 44 in a second enclosure portion 68 with evaporator stacks 26 overlying corresponding semiconductor devices 20 on the circuit board 44. In one configuration, one respective evaporator stack 26 or stack assembly 98 may be used for each semiconductor device 20 of an electronic assembly 111. For example, if the electronic assembly 111 comprises a three-phase inverter, a respective evaporator stack 26 may be mounted above each corresponding semiconductor device 20 such that the circuit board 44 is populated with six total evaporator stacks 26. In one embodiment, the evaporator stack 26 has radially extending metal tabs 46 that extend outward near or at the first end 30 (e.g., bottom or floor 28) of the evaporator stack 26. The metal tabs 46 of the evaporator stack 26 can be connected or soldered the circuit board 44 for surface mounting of the evaporator stack 26. Further, the metal tabs 46 may comprise a lead frame for connection of device terminals of the semiconductor device 20 to corresponding metallic traces 21 of the circuit board 44.

As shown in FIG. 4A, the output terminals 47 of each phase of the electronic assembly 111 or inverter can be associated with a current sensor 97, such as magnetic field or electric field sensor to detect an electrical current level or magnitude of each output phase signal (e.g., pulse width modulated signal). The current sensor 97 is electromagnetically coupled to the current flowing in the metallic trace 21 of the circuit board 44, but is not directly electrically coupled to the metallic trace 21 of the circuit board 44.

FIG. 4B is a perspective view of an alternate embodiment of the electronic assembly 211. The electronic assembly 211 of FIG. 4B is similar to the electronic assembly of FIG. 4A, except the evaporator stacks 26 overlies a portion (e.g., metallic pad, thick metallic pad, or heavy pour) of the metallic traces 21 of the circuit board 44 and the evaporator stacks 26 are near corresponding semiconductor devices 120 of each phase. Here, in the electronic assembly 211 the evaporator stack 26 can be used independent of the packaging of the semiconductor device (e.g., 120); hence the manufacturer of the semiconductor device. For example, as illustrated, the semiconductor device 120 has an integral finned heat sink or other integral heat sink. If the semiconductor device 120 comprises a power transistor of an inverter, a single phase of an inverter requires two transistors and may have a common output in which the output terminals of the high-side transistor and low-side transistor of a phase are connected. In practice, the output terminals of a transistor in an inverter can comprise the drain and source of a field-effect transistor, or the collector and emitter of bipolar junction transistors. The lead frame 99 of each semiconductor device 120 is soldered or connected to corresponding metallic traces 21. The direct current (DC) terminals provide direct current energy to the semiconductor devices 120.

FIG. 4C is an enlarged view of the rectangular area labeled 4C in FIG. 4B. As illustrated in FIG. 4B and FIG. 4C, one evaporator stack 26 overlies a metallic trace 21 at or near the output phase terminal near a pair of semiconductor devices 120 (e.g., transistors for a phase of the inverter). In one configuration, the evaporator stack 26 can be positioned at a target clearance with respect to one or more semiconductor devices 120. The target clearance can be based an equidistant radial distance, r, from the vertical axis 77 of evaporator stack to a plurality of semiconductor devices 120, where a first radial distance, $d_1$, is equal to a second radial distance, $d_2$. The first radial distance is between the vertical axis 77 and the nearest point on the perimeter of the outer package of the semiconductor device 120; the second radial distance is the between the vertical axis 77 and the nearest point on the perimeter of the outer package of the semiconductor device 120. Further, the target clearance may maintain a separation between a closest point of outer package of the semiconductor device 120 and the maximum radial extent of the evaporator stack from a substantially vertical axis 77 of the evaporator stack 26. The evaporator stack 26 target clearance may depend upon manufacturing tolerances of the semiconductor package, the evaporator stack 26 and coefficient of thermal expansion of the semiconductor package and the evaporator stack.

In another configuration, the evaporator stack 26 can be positioned: (1) as near as possible to the packages of the semiconductor devices 120 with allowances for manufacturing tolerances and thermal expansion, (2) equidistantly from the semiconductor devices 120 of a single phase that are cooled, and/or (3) at or near the junction point of metallic traces 21 of the output terminals (e.g., via tabs 46 or lead frames) from the semiconductor devices 120 of the same output phase of an inverter, such as at a mounting pad 25 (e.g., microstrip pad) or heavy pour of the circuit board 44. As illustrated in FIG. 4B and FIG. 4C, the junction point of the metallic traces 21 for output terminals of the output phase is equidistant in trace length from the corresponding device terminals of the semiconductor devices 120 to avoid imbalanced heat dissipation between the semiconductor devices 120 (e.g., high-side and low side transistors) of the same phase of an inverter or similar electronic assembly.

In one embodiment, the hollow body 42 of the evaporator stack 26 is substantially cylindrical. As illustrated in FIG. 10, the hollow body 42 of the evaporator stack 26 has a lower portion 48 and an upper portion 50, the lower portion 48 having sloped walls 52 and the upper portion 50 being substantially cylindrical, wherein the walls 52 are sloped radially outward and downward toward the floor 28. Further, the upper portion 50 has an outer surface 54 that engages the corresponding opening 38 of the corresponding condensation container 36. The evaporator stack 26 may resemble a miniature cooling tower or stack that is mountable on a circuit board 44 or other substrate.

The floor 28 of an interior 60 of the evaporator stack 26 comprises a series or raised protrusions 58 for cooling. The floor 28 of an interior 60 of the evaporator stack 26 comprises a set of ridges, fins, substantially cylindrical protrusions 58, or elevated patterns of islands extending above a lower background surface.

Figure 11A:
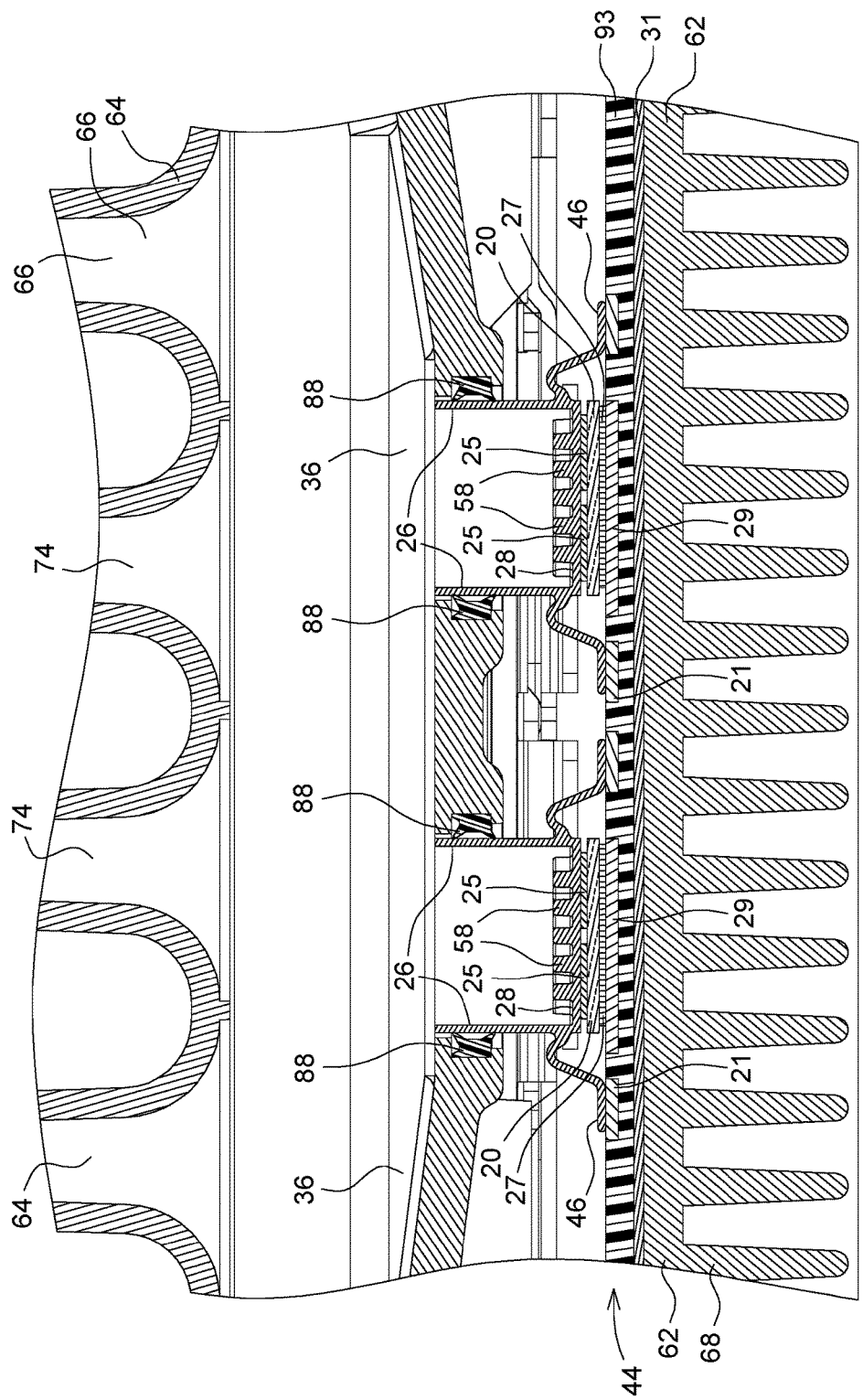
FIG. 11A is a cross-section of one embodiment of the evaporator stack assembly as viewed along reference line 11-11 of FIG. 8, where the bottom of the evaporator stack is bonded to or directly overlies at top metallic pad of the semiconductor device.

In one embodiment, as illustrated in FIG. 10 and FIG. 11A, a floor 28 or bottom of the evaporator stack 26 overlies the first side 22 of the semiconductor device 20. The evaporator stack 26 is composed of a metal or an alloy, such as copper or a copper alloy. The first side 22 of the semiconductor device 20 is bonded to the first end 30 at a bottom side of the evaporator stack 26. For example, a metallic pad 25 on the first side 22 of the semiconductor device 20 can be soldered to (or electrically and mechanically connected to) the first end 30 of the evaporator stack 26. One or more metallic pads 25 on the first side 22 of the semiconductor device 20 can be electrically connected or coupled to metal tabs 46, a lead frame, or other terminals of the semiconductor device 20, which are soldered or bonded to metallic traces 21 on an upper side of the circuit board 44. A second side 24 of the semiconductor device 20 is opposite the first side 22. Metallic pads 25 on the second side 24 of the semiconductor device 20 may be bonded to or electrically connected to electrically conductive pads 29 or metallic traces 21 on the upper side of the circuit board 44.

Figure 11B:
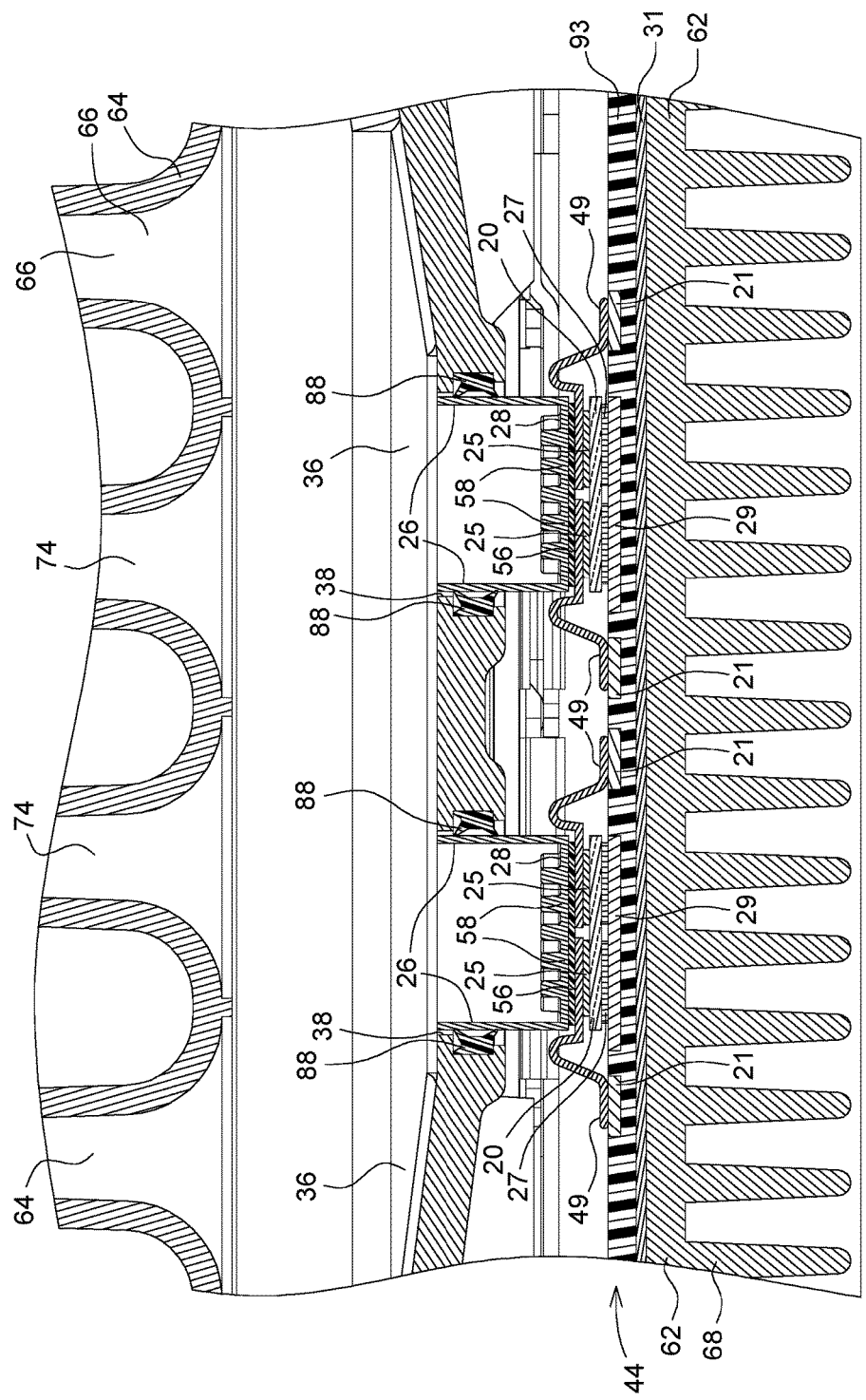
FIG. 11B is a cross-section of another embodiment of the evaporator stack assembly as viewed along reference line 11-11 of FIG. 8, where the bottom of the evaporator stack is electrically isolated from the top metallic pad of the semiconductor device by dielectric thermal interface material.

In another embodiment, as illustrated in FIG. 11B, the first side 22 of the semiconductor device 20 (or the heat-generating component) has a thermal interface material 56 between the first side 22 of the semiconductor device 20 (or heat-generating component) and the first end 30 of the evaporator stack 26. One or more metallic pad 25s on the first side 22 of the semiconductor device 20 are connected to lead frame 99 or terminals, which are soldered or bonded to metallic traces 21 on an upper side of the circuit board 44. A second side 24 of the semiconductor device 20 is opposite the first side 22. Metallic pads 27 on the second side 24 of the semiconductor device 20 may be bonded to or electrically connected to conductive pads 29 or metallic traces 21 on the upper side of the circuit board 44.

Figure 5:
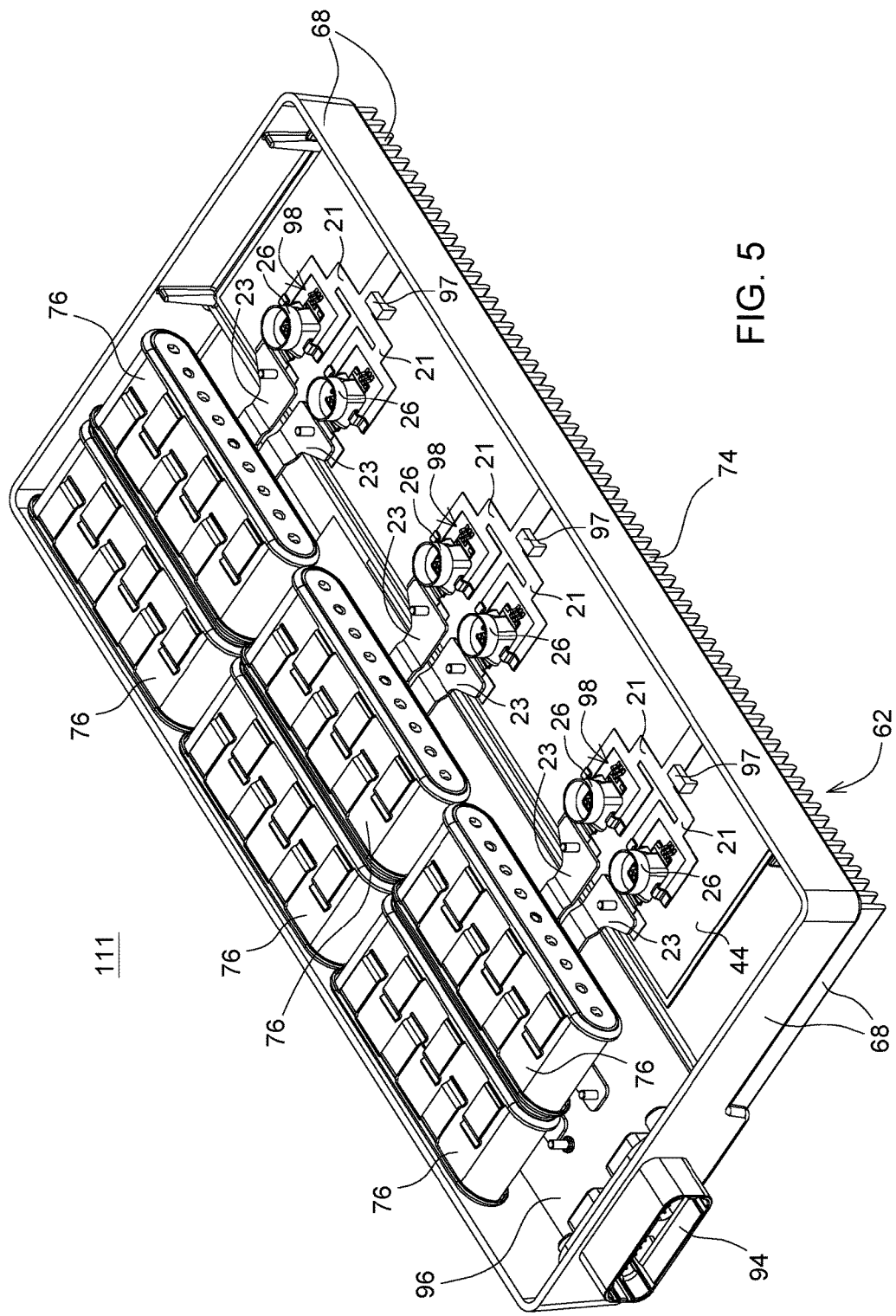
FIG. 5 is a perspective view of the second enclosure portion of FIG. 4A further comprising an array or bank of capacitors mounted in the second enclosure portion.

FIG. 5 is a perspective view of the electronic assembly 111 and its second enclosure portion 68 of FIG. 4A that further holds an array or bank of capacitors 76 mounted in the second enclosure portion 68.

Figure 6A:
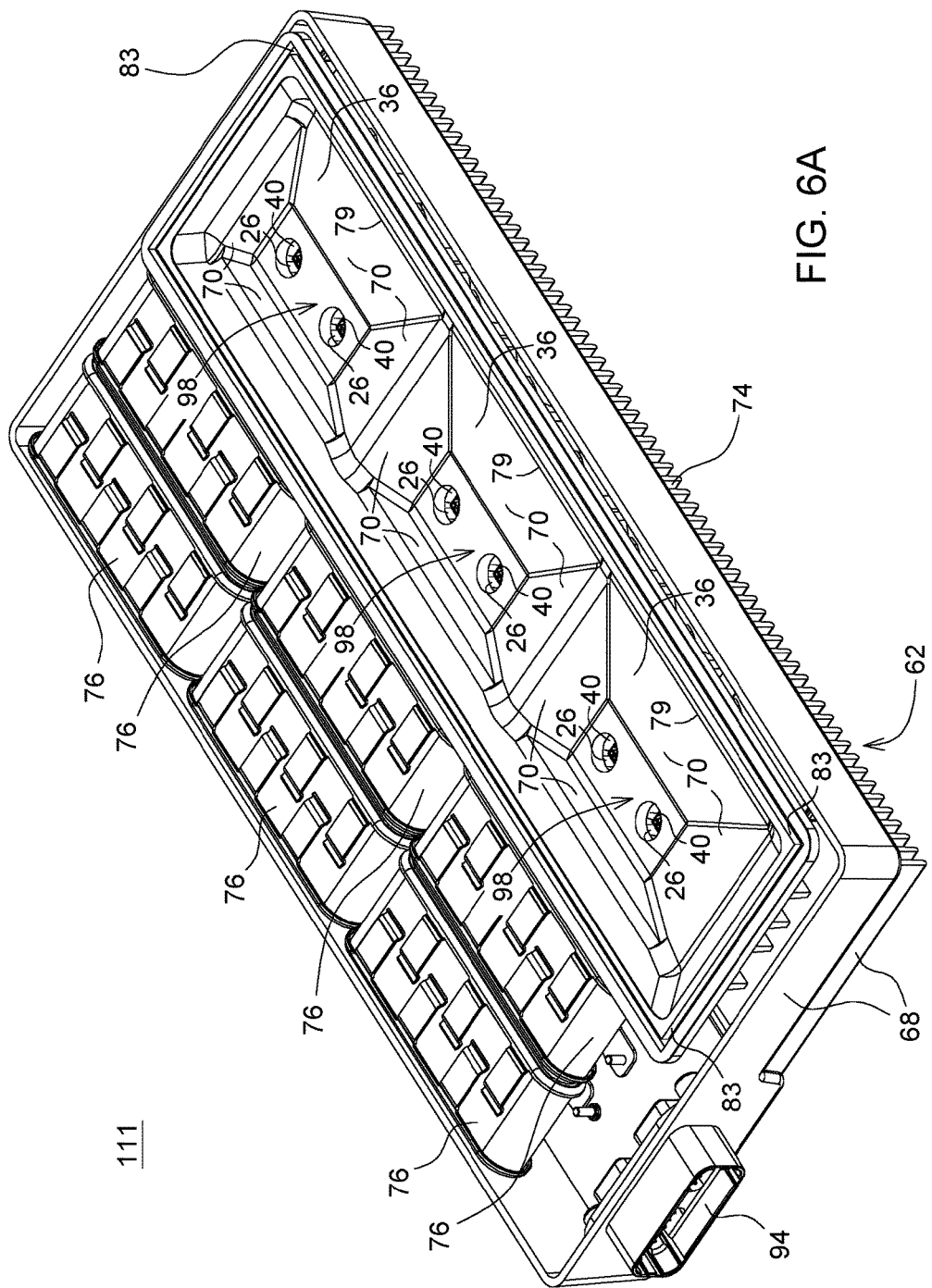
FIG. 6A is a perspective view of one embodiment of the second enclosure portion of FIG. 5 further comprising condensation containers above corresponding evaporator stacks with seals in grooves around a lid opening of each condensation container.

FIG. 6A is a perspective view of one embodiment of the electronic assembly 111 that comprises condensation containers 36 above corresponding evaporator stacks 26, where the second enclosure portion 68 holds the circuit board 44, evaporator stacks 26 and the condensation containers 36. In FIG. 6A, the lid 82 or first enclosure portion 66 of the condensation containers is removed to better reveal and illustrate the interior of the condensation containers 36. Each condensation container 36 has sloped floors 70 support or facilitate drainage of condensed liquid-phase coolant into the evaporator outlet 40 of each evaporator stack 26.

The condensation containers 36 are associated with a containment seal 84 in a groove 83 or channel in the second enclosure portion 68, where the groove 83 runs around a perimeter of the lid opening 79 for the condensation containers 36. The lid opening 79 can be covered by the condensation container lid 82 or first enclosure portion 66. As illustrated, a group of condensation containers 36 collectively form a single condensation chamber or condenser with a lid 82 that is defined by a portion of the upper heat sink 64 or first enclosure portion 66. The containment seal 84 rests in a groove 83 around the lid opening 79 for the condensation chamber that seals against the lid 82, which is defined by an interior mating surface of the first enclosure portion 66. Accordingly, while multiple evaporator stacks 36 (e.g., six evaporator stacks in FIG. 6A) feed collectively a single condensation chamber with gas-phase coolant, each condensation container 36 locally drains coolant in the liquid-phase to its corresponding evaporator stack or stacks 26.

Although the containment seal 84 engages single perimeter groove 83 that surrounds multiple condensation containers 36, in an alternate embodiment, the alternate condensation containers may be separated from each other into separate, discrete volumes. Further, each alternate condensation container has a separate lid opening with a corresponding groove and associated seal for mating with the first enclosure portion 66. Accordingly, one or more evaporator stacks 36 (e.g., a pair of evaporator stacks in FIG. 6A) feed collectively a single condensation chamber with gas-phase coolant, each condensation container 36 locally drains coolant in the liquid-phase to its corresponding evaporator stack or stacks 26.

In one embodiment, the lid 82 has internal and external features to promote condensation of the coolant on the interior surfaces. In one example, the interior surface of the lid 82 may have internal fins in the condensation containers. 36 or condensation chamber to promote condensation of the coolant. In another example, the interior surface of the lid 82 has a wavy shape to add more surface area to promote condensation of the coolant. In another example, the interior surface of the lid 82 or the interior of the condensation container 36 has vertical tubes, which can be brazed to the lid 82 for more aggressive condensation needs as this provides even more surface area. The external fins 74 on the exterior of the upper heat sink 64 support air cooling of the condensation containers 36 that facilitates condensation in their interiors.

In one example, the upper heat sink 64 is thermal communication with the semiconductor device 20 because the top, lid 82 or ceiling of the condensation container 36 is formed by a lower surface of the upper heat sink 64 or the first enclosure portion 66. The containment seal 84, optional gasket 86 or both around the lid opening 79 of the condensation container 36 or condensation chamber forms a hermetic seal to confine the coolant 34 (regardless of liquid phase or gas phase) to the condensation container 36 and associated evaporator stack 26.

In an alternate configuration, the first enclosure portion 66 or upper heat sink 64 is in thermal communication with the semiconductor device 20 where the condensation container 36 has its own top, lid 82 or ceiling (e.g., integral top) that adjoins or contacts the upper heat sink 64 or first enclosure portion 66.

Figure 6B:
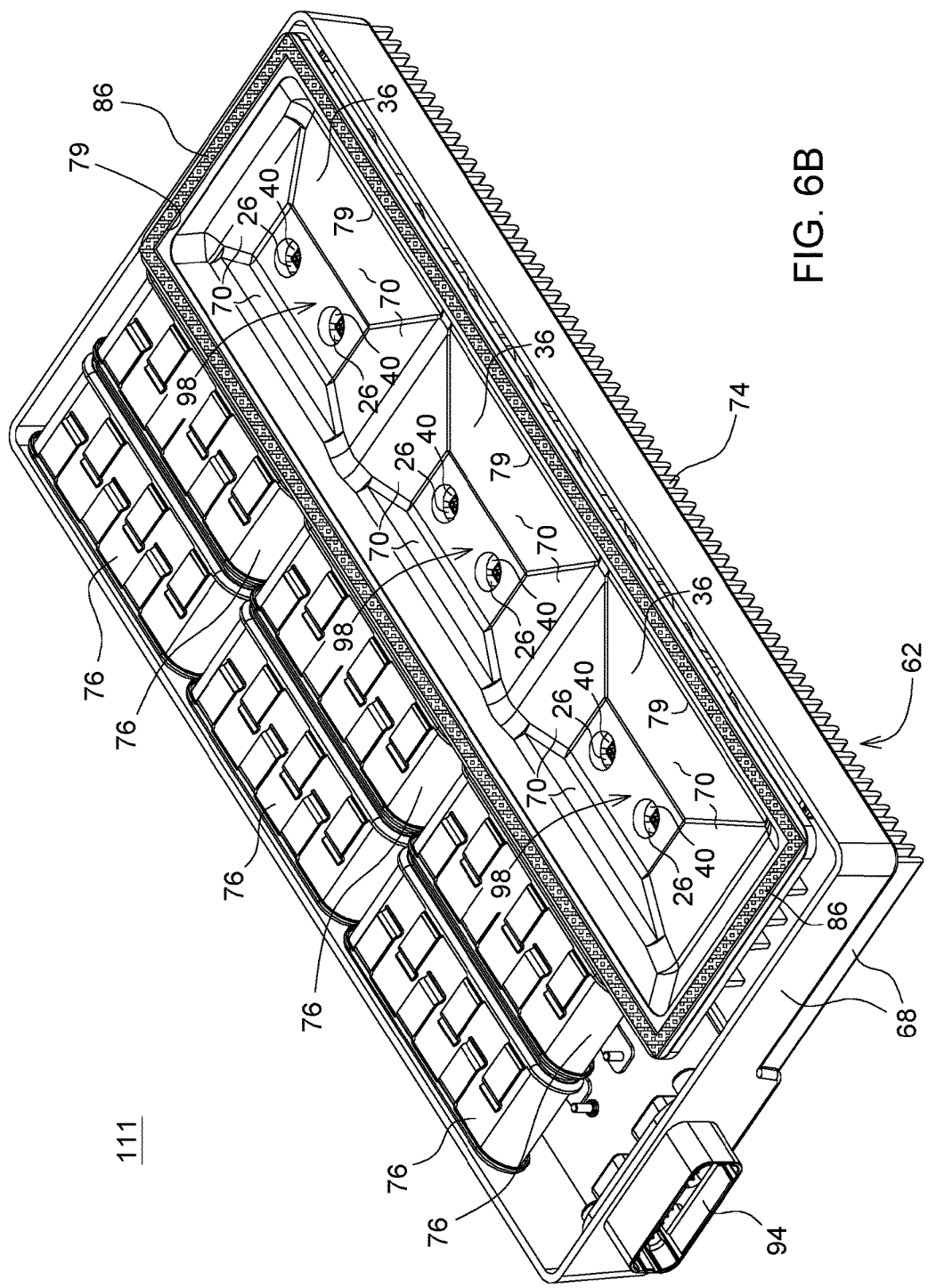
FIG. 6B is a perspective view of another embodiment of the second enclosure portion of FIG. 5 further comprising condensation containers above corresponding evaporator stacks with gaskets around a lid opening of each condensation container.

FIG. 6B is a perspective view of another embodiment of the electronic assembly 111 of FIG. 5. The embodiment of the electronic assembly 111 FIG. 6B is similar to the embodiment of FIG. 6A except, that the embodiment of FIG. 6B further comprises condensation containers 36 above corresponding evaporator stacks 26 with a gasket 86 around a perimeter the lid opening 79 of the condensation chamber formed by multiple condensation containers 36. The electronics assembly of FIG. 6B is similar to the electronics assembly 111 of FIG. 6B, except the electronics assembly of FIG. 6B uses a gasket 86 (e.g., a gasket on a step or flange of the second enclosure portion 68) instead of the groove 83 with the elastomeric seal, or uses the gasket 86 with the groove and the elastomeric seal.

FIG. 6C is a perspective view of an alternate embodiment of the first enclosure portion 66 further comprising condensation containers 36 above corresponding evaporator stacks 26 of FIG. 4B. The electronics assembly 111 of FIG. 6C is similar to the electronics assembly 111 of FIG. 6B, except each phase only has one evaporator stack 26 that engages a corresponding opening 38 in the condensation container 36. Each condensation container 36 in FIG. 6C has a single opening 38 in the bottom to receive the corresponding evaporator stack 26 and to drain coolant in the liquid-phase into the evaporator stack 26. The opening 38 in each condensation chamber 36 only exposes a single evaporator stack 26, such as single evaporator stack 26 to cool each phase if the electronics assembly comprises an inverter.

In one embodiment, a lower heat sink 62 or first enclosure contacts, faces or adjoins a lower side of the circuit board 44, where the lower side of the circuit board 44 comprises a metal base, metallic layer 31 (e.g., in FIG. 11B), or metallic ground plane. In FIG. 4B and 6C, the semiconductor device 120 can be cooled simultaneously by the lower heat sink 62 that is adapted to transfer thermal energy to the ambient air and by the evaporator stack 26 that facilitates a phase-change between a liquid phase and a gas phase.

Figure 7A:
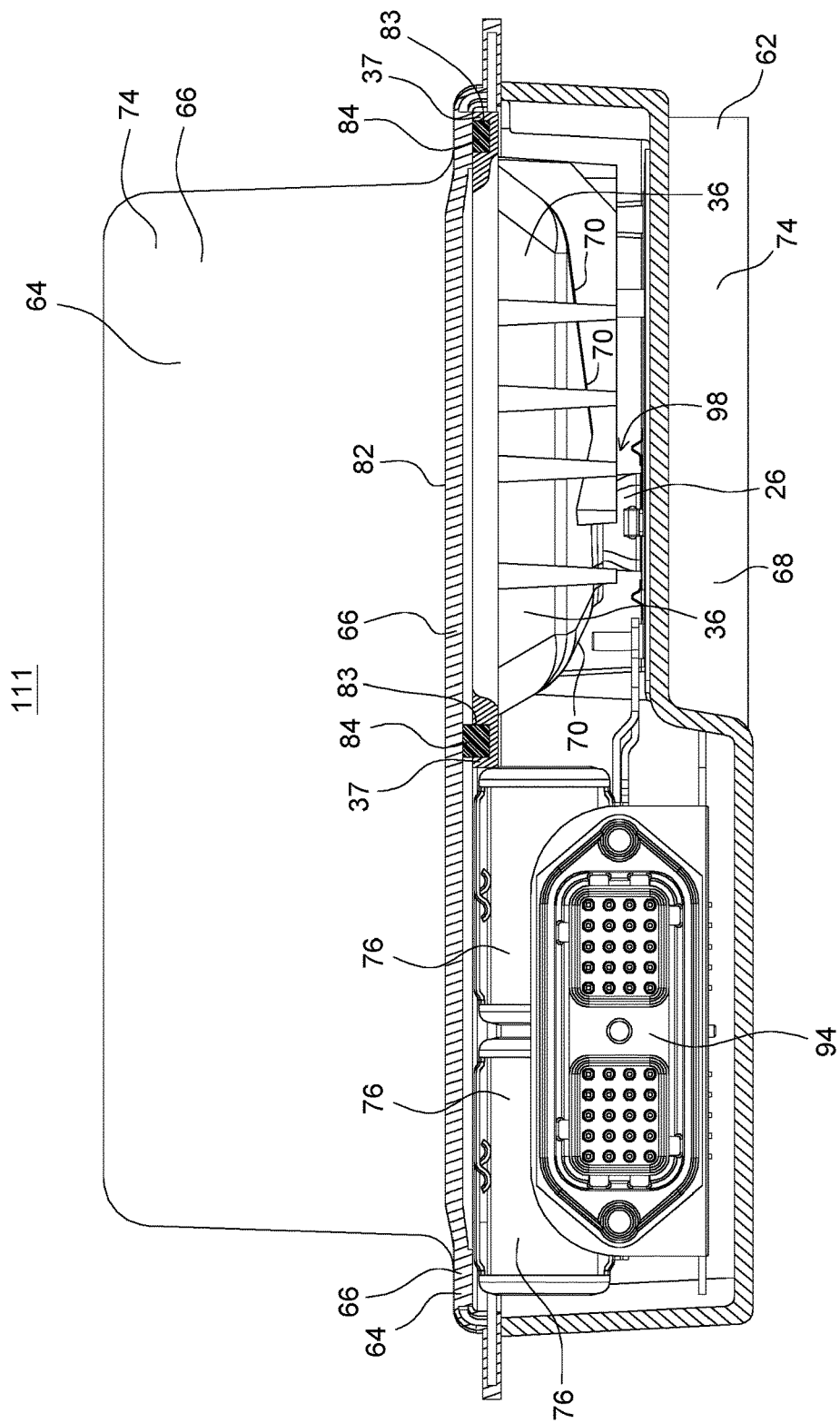
FIG. 7A shows a cross-section of the electronic assembly as viewed along reference line 7-7 of FIG. 1 with seals between the first enclosure portion (e.g., condensation lid) and the condensation containers.

FIG. 7A shows a cross-section of the electronic assembly 111 as viewed along reference line 7-7 of FIG. 1 with the containment seal 84 between the first enclosure portion 66 (e.g., lid 82) and the condensation containers 36, which are collectively referred to as the condensation chamber. The containment seal 84 supports a hermetic seal of the lid 82 to the condensation containers 36. In one embodiment, the containment seal 84 comprises an elastomeric seal that reside in a respective groove 83 or channel in a top flange 37 of the condensation container 36 or condensation containers 36. The sloped floor 70 of the condensation container 36 is evident in FIG. 7A and FIG. 7B to facilitate drainage or movement (without pumping) of condensed liquid-phase coolant (e.g., refrigerant) into the stack outlet 40 of each stack 26.

Figure 7B:
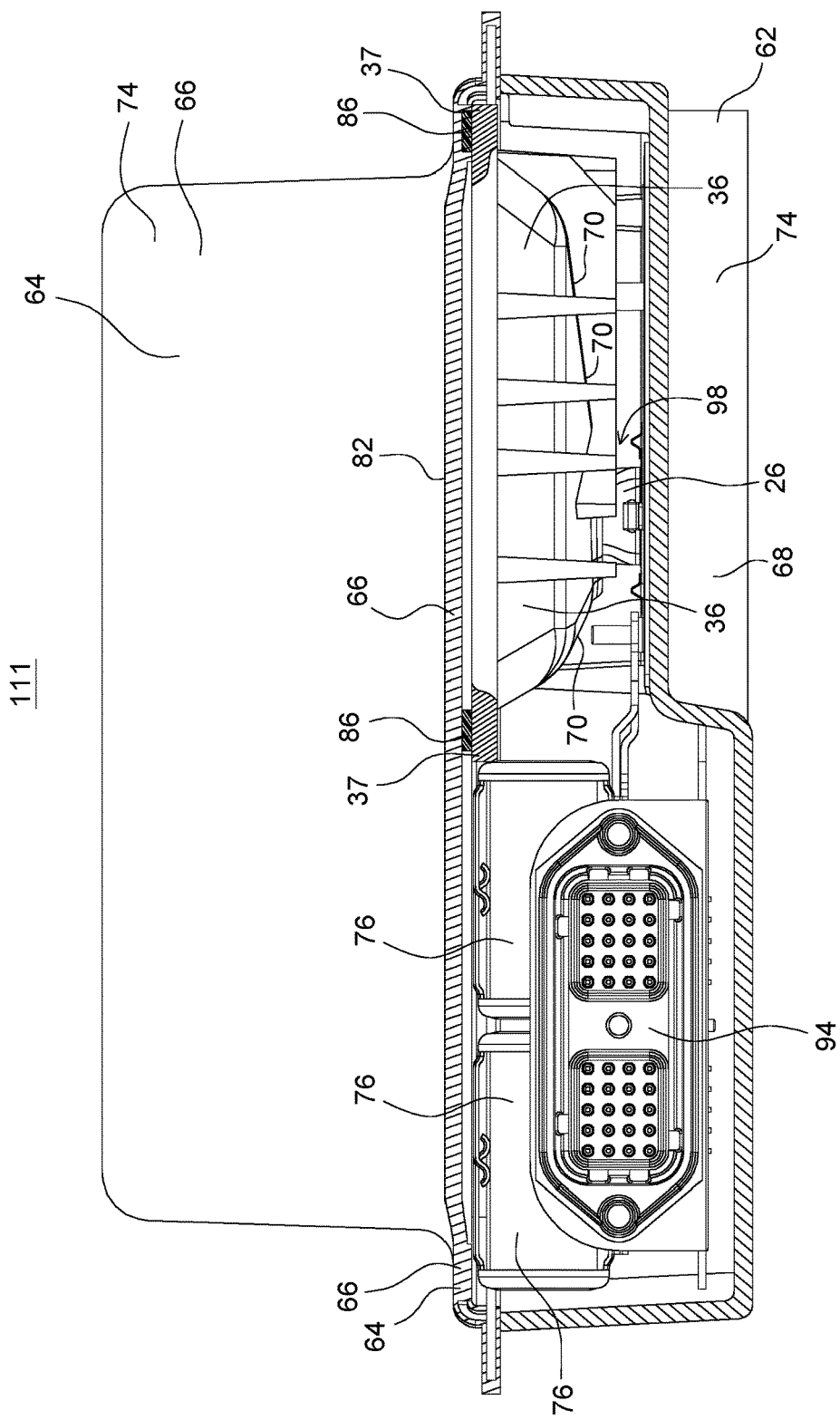
FIG. 7B shows a cross-section of the electronic assembly as viewed along reference line 7-7 of FIG. 1 with gaskets between the first enclosure portion (e.g., condensation lid) and the condensation containers.

FIG. 7B shows a cross-section of the electronic assembly 111 as viewed along reference line 7-7 of FIG. 1. The electronic assembly 111 of FIG. 7B is similar to the electronic assembly 111 of FIG. 7A, except the containment seal 84 and corresponding groove 83 are replaced with gasket 86 between the first enclosure portion 66 (e.g., lid 82) and the condensation containers 36.

In an alternate configuration, multiple separate containment seals and corresponding grooves in flanges of the condensation chambers may be used to seal 84 hermetically each condensation chamber to a lid formed by a portion of the first enclosure portion 66 or upper heat sink 64.

Figure 8:
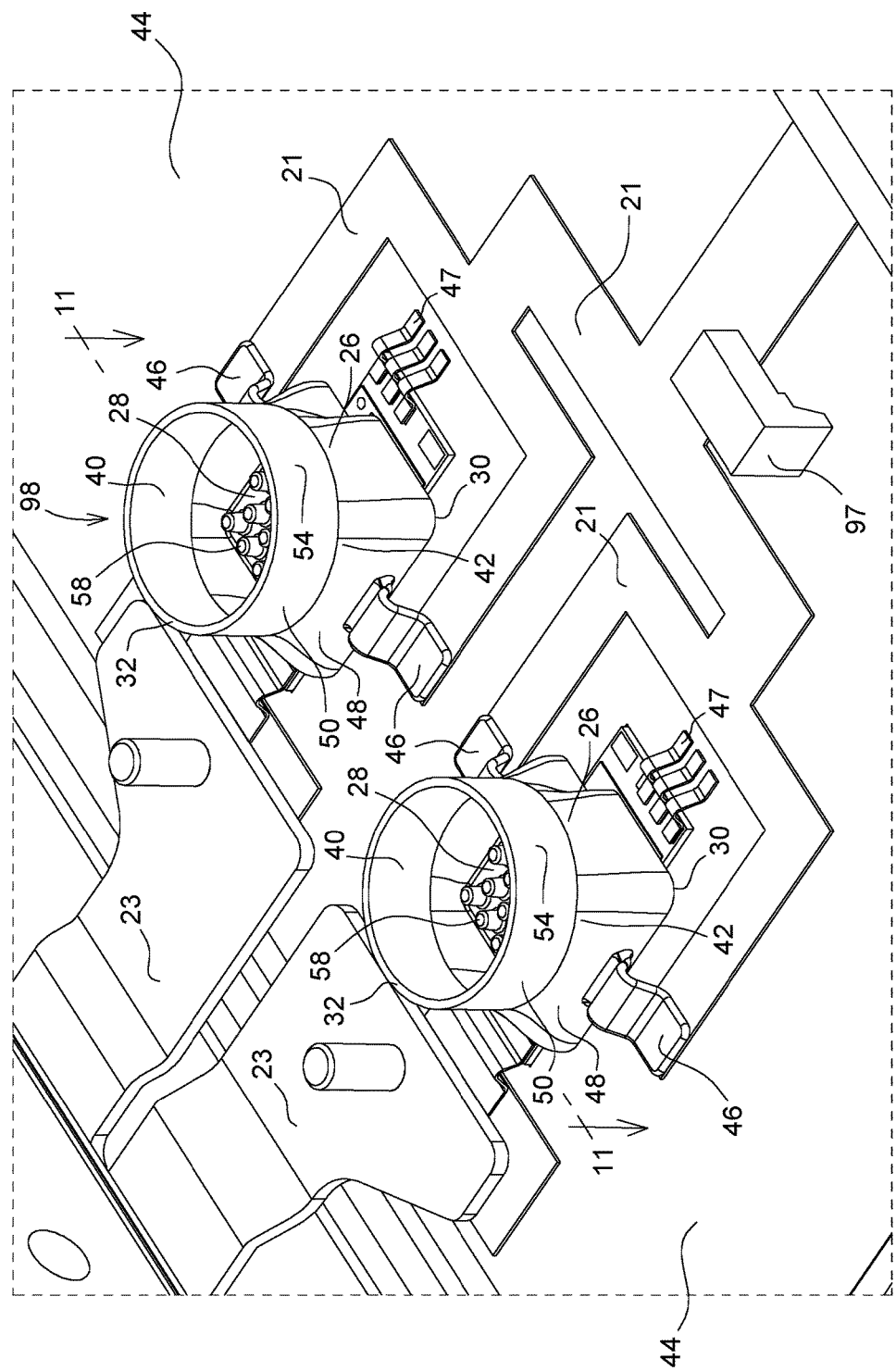
FIG. 8 is an enlarged rectangular view of portion of the electronic assembly as indicated by the dashed rectangle 8 of FIG. 4A.

FIG. 8 is an enlarged rectangular view of portion of the electronic assembly 111 as indicated by the dashed rectangle 8 of FIG. 4A. Each evaporator stack 26 has a protrusions 58 on its floor to promote changing of the liquid-phase of the coolant to the gas-phase of the coolant. FIG. 8 illustrates that the walls of the lower portion 48 of the evaporator stack are sloped outward and downward. In FIG. 8, the semiconductor device 20 has device terminals that are electrically connected to terminals 47, such as lead frame terminals. Similarly, the direct current terminals 23 are connected to device terminals (e.g., via lead frame terminals) of the semiconductor device 20 to provide electrical energy to the semiconductor device.

FIG. 9A is a cross section of the electronic assembly 111 as viewed along reference line 9-9 of FIG. 1 with a containment seal 84 between the first enclosure portion 66 and the condensation containers 36. The condensation container lid 82 is defined by a portion of the upper heat sink 64 or the first enclosure portion 66. The coolant 34 can occupy the condensation containers 36 is a gas-phase of the coolant in a central volume and its interior surfaces tend to support condensation or conversion of the gas-phase into the liquid-phase to drain into and resupply the evaporator stack with coolant in the liquid-phase.

Figure 9B:
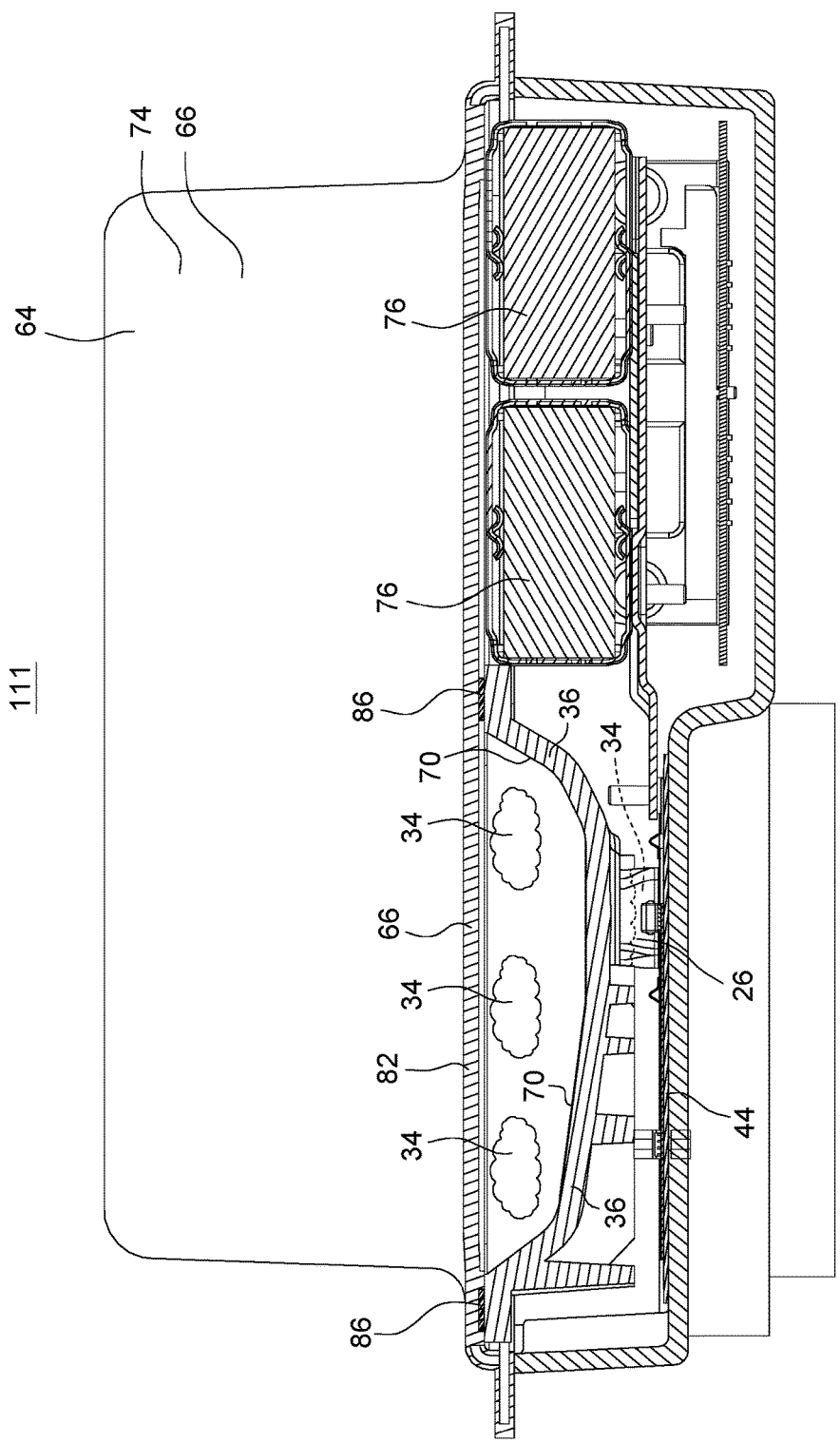
FIG. 9B is a cross section of the electronic assembly as viewed along reference line 9-9 of FIG. 1 with gaskets between the first enclosure portion and the condensation containers.

FIG. 9B is a cross section of the electronic assembly 111 as viewed along reference line 9-9 of FIG. 1. The electronics assembly of FIG. 9B is similar to the electronics assembly of FIG. 9A except the containment seal 84 and corresponding groove 83 is replaced with gasket 86 between the first enclosure portion 66 and the condensation containers 36.

Figure 9C:
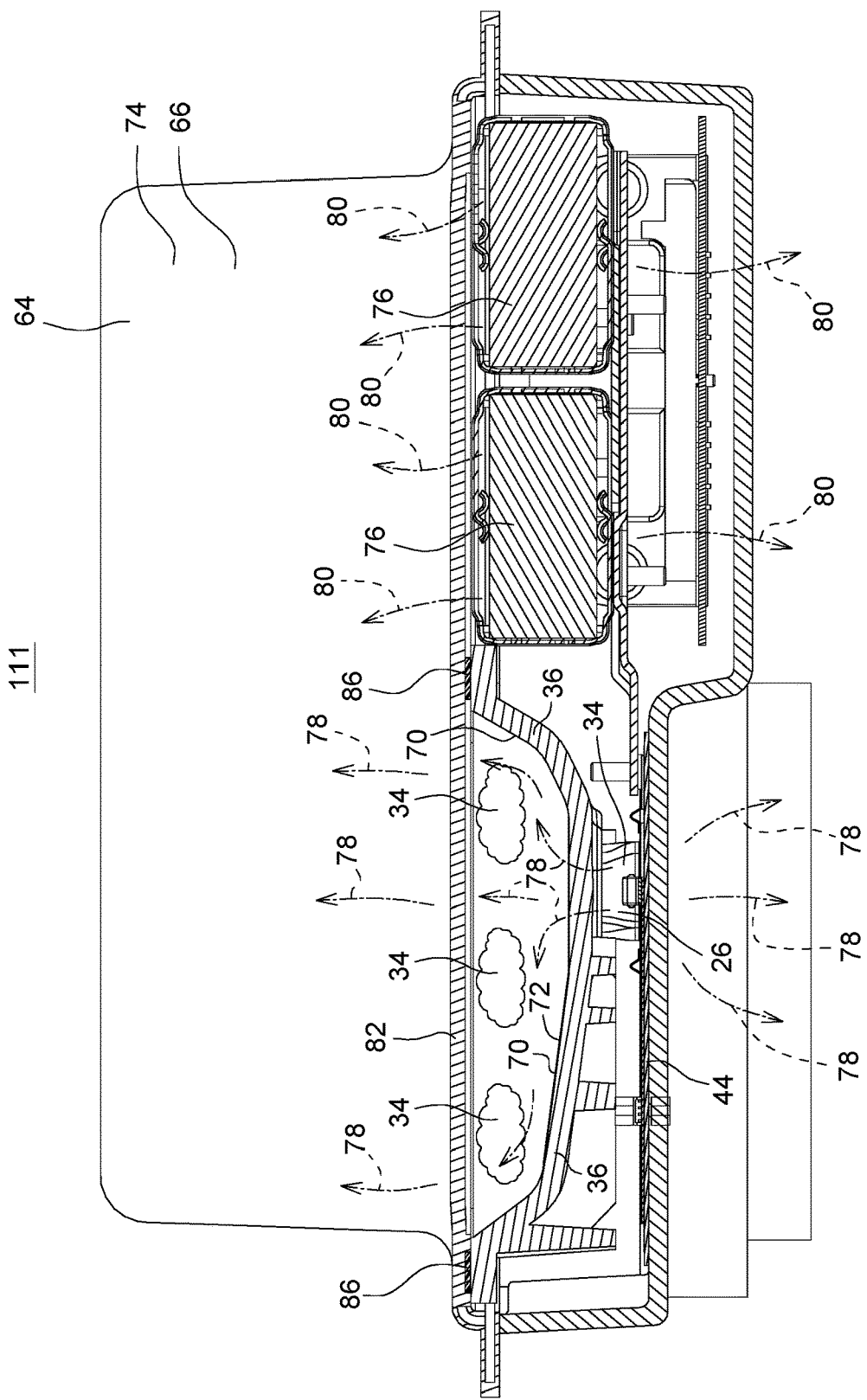
FIG. 9C is a cross section of the electronic assembly as viewed along reference line 9-9 of FIG. 1 with arrows showing the direction of heat flow away from the heat-generating semiconductor and the capacitors

FIG. 9C is a cross section of the electronic assembly 111 as viewed along reference line 9-9 of FIG. 1 with arrows showing the direction of heat flow away from the heat-generating semiconductor (20, 120) and the capacitors 76. A first thermal path 78 for heat dissipation from the semiconductor or semiconductors (20, 120) is generally separate from a second thermal path 80 for heat dissipation from the capacitors 76. The heat generating semiconductors (20, 120) are predominately cooled by the two-phase cooling, whereas the capacitors 76 are primarily cooled by air-cooling with fins 74 on the outside and optional fins on the inside of the enclosure (66, 68).

In one embodiment, the electronic assembly 111 supports the circulation of the coolant 34 (e.g., refrigerant) without any pump. For example, the condensation container 36 comprises a sloped floor 70 that allows condensation of the coolant 34 that forms on interior surfaces 72 of the condensation container 36 to drain back to the evaporator stack 26 by gravity. The coolant 34 does form or is capable of forming on the interior surfaces 72 when a liquid phase changes back to a gas phase. In one embodiment, the phase-change of the coolant 34 transitions to a gas phase in the evaporator stack 26, transitions to a liquid phase in the condensation container 36, and returns by gravity to the evaporator stack 26 in liquid phase. Accordingly, the coolant 34 is circulated by phase-change of the coolant 34, the sloped floor 70 of the condensation container 36, and without any pump.

The evaporator stack 26 comprises an evaporation zone or evaporation volume bounded by its floor 28 at its first end 30 (e.g., bottom) adjacent to a first side 22 (e.g., upper side) of a semiconductor device 20 and extending upward from the floor 28 and the associated protrusions 58. For example, a second end 32 (e.g. top) of the evaporator stack 26 defines an upper boundary of the evaporation volume and a first end 30 (e.g., bottom) of the evaporator stack 26 defines the lower boundary of the evaporation volume. The first end 30 or floor 28 of the evaporator stack 26 is in thermal communication with a respective semiconductor device 20 or a metallic pad 25 thereon.

The evaporator stack 26 has an evaporator stack vertical axis 77 that extends vertically. The evaporator stack 26 axis is coaxial with the substantially cylindrical portion or the substantially cylindrical evaporator stack 26. The evaporator stack 26 has a wall or sloped wall 52 that is cylindrical, semi-conical, or inverted, funnel shaped. The wall 52 may form an additional boundary of the evaporation volume. Although the evaporation volume is characterized as an evaporation volume, in practice, the evaporation volume might support both the evaporation and condensation modes simultaneously, particularly when condensed coolant 34 drips down the wall or sides of the evaporator stack 26 (e.g., from the condensation container 36) toward the first side 22 of the semiconductor device 20. Sometimes, the coolant 34 may appear to condense on the wall or sides of the evaporator stack 26.

The condensation container 36 comprises a condensation zone or condensation volume that is greater than the evaporation zone or evaporation volume. The condensation volume is defined by a respective condensation container 36 above the corresponding evaporator stack 26 that communicates with the outlet 40 in the evaporator stack 26 via an opening 38 in the condensation container 36. For example, an outer surface 54 of the cylindrical portion of the evaporator stack 26 may interface or join with the opening 38 in the condensation container 36. From an evaporator stack outlet 40 of the evaporator stack 26, the gas-phase enters the condensation zone or condensation volume of the condensation container 36.

In an evaporator stack 26, the coolant 34 changes phase from a liquid-phase to a gas-phase, while absorbing heat. In a condensation container 36 or in the condensation container 36, the coolant 34 changes phase from a gas-phase to the liquid-phase by cooling the coolant 34. The condensed coolant 34 or condensation forms in the condensation zone or condensation volume within the condensation container 36 or on the interior surfaces 72 of the condensation containers 36 and even on the lid 82 that seals the condensation containers 36 to confine the coolant 34 from reaching the ambient air or environment.

In one configuration, the coolant 34 is circulated in the following manner that eliminates any need for a pump to circulate or pump coolant 34. First, the coolant 34 in liquid phase interacts, directly or indirectly, with the heated first side 22 of the semiconductor device 20, the floor 28 of the evaporator stack 26 (with or without interior 60 protrusions 58), or an adjoining surface in thermal communication with the heated first side 22 of the semiconductor device 20. Second, the interaction with the heated first side 22 results in some portion of the coolant 34 converted or changed from a liquid-phase to gas-phase. Third, the heated gas-phase coolant 34 rises into the condensation container 36 or chamber. Fourth, the gas-phase coolant 34 cools on one or more walls or interior surfaces 72 of the condensation container 36 and the lid 82. Fifth, the cooled condensation of the coolant 34 in the liquid-phase drips, runs or circulates into the evaporator stack 26 to repeat the above process. Prior to introduction of pressurized refrigerant into the sealed volume defined by the evaporator stack 26, the condensation containers 36 and the lid 82, the sealed volume may be subjected to a vacuum.

In accordance with the embodiments of this disclosure, the electronic assembly 111 uses a two-phase cooling process for the coolant 34 in a passive way that does not require any pump or active circulation of the coolant 34. The coolant 34 at the first end 30 or floor 28 of the evaporator stack 26 turns into vapor or gas-phase when the first side 22 or surface of power semiconductor (20, 120) heats above critical temperature upon application of the electrical power (e.g., to the electronic assembly, 111 or 211). The vapor or gas-phase rises above the surface of the power semiconductor (20, 120) and in that process phase-change liquid removes heat by evaporation. This phase change of the liquid coolant 34 into vapor causes rapid removal of heat from the concentrated surface of power semiconductor device 20 or devices. Further, each pair of the evaporator stack 26 and the condensation container 36 collectively distribute the heat to a large area that can be effectively and successfully dissipate thermal energy from one or more semiconductor devices 20.

The combination of the evaporator stack 26 and the condensation container 36 may be referred to as a two-phase thermal interface. The two-phase thermal interface provides heat transfer from one or more semiconductor devices 20 by liquid to air by phase-change of the liquid coolant 34 makes the proposed thermal management systems pump-free, simple, independent, and self-contained systems.

Concentrated heat originates from each semiconductor device 20 and the two-phase thermal interface spreads the thermal energy over a large area so it can be removed by passing it to the surrounding air via the upper heat sink 64, the lower heat sink 62, or both. This disclosure facilitates cooling via the metallic pads 25 or other terminals of the power semiconductor (e.g., silicon insulated-gate bipolar transistor (IGBT), silicon carbide (SiC) metal oxide semiconductor field effect transistor (MOSFET) devices, or gallium nitride (GaN) semiconductor devices) via the two-phase thermal interface on the first side 22 of the semiconductor device 20 and via the lower heat sink 62 on the second side 24. Further, the upper heat sink 64 removes heat from the first side 22 thermal communication of thermal energy from the semiconductor device 20 or devices via one or more two-phase thermal interfaces.

The condensation container 36 or vapor chamber can be formed of a dielectric material to provide electrical isolation between the upper heat sink 64 and the semiconductor devices 20, for example. Because the coolant 34 goes through a phase change, the two-phase thermal interface enables rapid, efficient heat transfer from the concentrated source as it boils and the vapor is able to quickly distribute over the large area available because of enclosure of the electronic device, and its associated upper heat sink 64 and lower heat sink 62. In one embodiment, the surface area of the enclosure, the upper heat sink 64, the lower heat sink 62, which both can be finned, are large enough to use air-cooling to condense the cooling media and complete the full cycle of the coolant 34 within the electronic assembly 111. In certain configurations, the electronic assembly 111 can provide a self-contained cooling system for high power density inverters without any pump.

In one configuration, one or more electrical conductors or conductive pads 25 on the first side 22 (e.g., upper side) of the semiconductor device 20 (e.g., planar power semiconductor chipset) contact, adjoin or are bonded to (e.g., soldered or brazed to) the evaporator stack 26. The evaporator stack 26 has a hollow relatively tall cylindrical shape that makes a chimney type structure. The evaporator stack 26 is connected for fluidic communication to a condensation container 36 (e.g., vapor chamber), where the condensation volume of the condensation container 36 is greater than of the evaporator stack 26 volume of the evaporator stack 26. The condensation container 36 or chamber between the first enclosure (e.g., upper heat sink 64) and the evaporator stack 26 is either made completely from a dielectric material or has portions of it made from a dielectric material so there is appropriate electrical isolation.

In FIG. 10 in one embodiment, the first enclosure 66 or upper heat sink 64 facilitates condensation of the coolant 34 from vapor phase to liquid phase in the condensation container 36. In one embodiment, a radial seal 88 is positioned between the evaporator outlet 40 and the opening 38 in the lower surface of the condensation container 36 to allow hermetically sealed axial motion or sliding between the evaporator stack 26 and the condensation container 36, where the metallic evaporator stack 26 and the dielectric condensation container 36 have different coefficients of thermal expansion. The radial seal 88 maintains a proper hermetic seal during axial motion to support assembly of the electronic assembly 111, where each opening 38 in condensation container 36 is mated with the corresponding evaporator stack 26. Further, the radial seal 88 supports some strain relief and axial adjustment during assembly and in the manufacturing tolerances of one or more of the following: evaporator stack 26, condensation container 36, first enclosure portion 66, and second enclosure portion 68.

The radial seal 88 may comprise a single lip seal, a dual lip seal, an elastomeric O-ring, an elastomeric seal, a synthetic rubber seal, a radial shaft seal, an interface seal, a hybrid seal that is a combination of an annular elastomeric seal and a dual lip seal, or another seal configurations. The elastomeric material of the radial seal 88 is composed of material that is compatible with the coolant 34 or refrigerant.

In one embodiment, a seal 84 (e.g., an elastomeric seal) or sealant is positioned between the condensation container 36 (e.g., at its mid-section or at flange 37) and the first enclosure portion 66 (e.g., upper heat sink 64) to form a fully enclosed condensation container 36 that can be vacuumed of standard atmosphere then pressurized and filled with the appropriate amount of the coolant 34, refrigerant, or phase-change liquid.

FIG. 11A is a cross-section of one embodiment of the evaporator stack assembly 98 as viewed along reference line 11-11 of FIG. 8, where the bottom of the evaporator stack 26 is bonded to or directly overlies at top metallic pad 25 of the semiconductor device 20. As illustrated in FIG. 11A the evaporator stack 26 is electrically charged and connected to an output terminal of the semiconductor device 20, such as a drain, source, emitter or collector of a power transistor. The evaporator stack 26 has voltage potential or electrical charge with respect to: (1) the enclosure, the first enclosure portion 66, the second enclosure portion 68, or the frame or chassis of the electronic assembly 111, and (2) any other phase output terminals if the electronic assembly 111 is a multi-phase inverter. The lower portion 48 of the stack 26 tends to carry most of the output alternating current signal (e.g., at the fundamental frequency) from the semiconductor devices 20 to the metallic traces 21 (e.g., microstrip traces with its ground plane) of the circuit board 44, whereas the upper portion 50 of the stack has no efficient current path (e.g., to ground). If the enclosure (66, 68) is composed of a metallic material, such aluminum or an aluminum alloy, the enclosure provides shielding to keep any electromagnetic radiation that might otherwise be radiated by the circuitry, evaporator stack 26, or metallic traces 21 on the circuit board 44 inside the enclosure.

The semiconductor device 20 has tabs 46 or lead frames for connection of the device terminals of the semiconductor device 20 to metallic traces 21.

In some configurations, as illustrated in FIG. 11A and FIG. 11B, the circuit board 44 comprises a metallic base layer 31, a dielectric layer 93 overlying the metallic base layer 31, and a one or more metallic traces 21 and metallic pads 29 overlying the dielectric layer 93. In one embodiment, the metallic base layer 31 comprises an aluminum or aluminum alloy, and adjoins or contacts the lower heat sink 62 or second enclosure portion 68. The metallic base layer 31 can increase the thermal mass of the lower heat sink 62 to improve thermal dissipation from the electronic assembly 111. The metal base layer may directly contact the lower heat sink 62 or may indirectly contact the lower heat sink 62 via thermal interface material 56, thermally conductive grease, or thermally conductive paste, for example.

FIG. 11B is a cross-section of another embodiment of the evaporator stack assembly 98 as viewed along reference line 11-11 of FIG. 8, where the bottom or first end 30 of the evaporator stack 26 is electrically isolated from the top metallic pad 25 of the semiconductor device 20 by dielectric thermal interface material 56. The device terminals 49 of the semiconductor device 20 are connected to the metallic traces 21 on the circuit board 44 via one or more lead frames 49, or directly to conductive pads 25, among other possibilities.

As illustrated in FIG. 11B, the evaporator stack 26 is not electrically charged and is not at the output potential of any output phase of the electronic assembly (e.g., inverter), but can be at chassis ground or electrical ground potential. The evaporator stack 26 can be electrically isolated from the metallic pad 25 or output terminal of the semiconductor device 20, or any associated metallic trace 21, by a dielectric thermal interface layer 56 that provides acceptable levels of thermal conductivity and electrical isolation/insulation. Therefore, the evaporator stack 26 of FIG. 11B does not radiate any material electromagnetic interference or radiation. Further, the enclosure can composed of metal or metallic material to attenuate any electromagnetic interference or radiation generated by the circuitry of the electronics assembly (111, 211).

In an alternate embodiment, the condensation container 36 may be molded or formed as a completely closed system to be added as a component to the electronic assembly 111 (e.g., inverter). The condensation containers 36 condensing interior surface would then have to interface with the second heat sink as separate heat sink, which adds thermal resistances by the material and thermal interface material (e.g., thermally conductive grease, paste or pad) used to make a sound thermally conductive interface between the heat sink and the condensation container 36.

In one configuration, the enclosure, the first enclosure portion 66 and the second enclosure portion 68, or both can be composed a metallic material, such as aluminum or an aluminum alloy, to shield against electromagnetic interference. The first enclosure portion 66 and the second enclosure portion 68 can have fins 74, ridges or other protrusions for enhanced thermal dissipation to the ambient air or environment.

Although not shown in the drawings (except for the protrusions 58 (e.g., studs or rods) extending from the floor of the evaporator stack), in an alternate embodiment, the evaporator stack 26 may have a stack interior 60 or exterior surfaces that comprise elevated features like fins, surface irregularities, or surface undulations to increase surface area and accelerate process of phase changes between the liquid phase and the gas phase of the coolant. Similarly, the condensation container may have interior surfaces 72 or exterior surfaces that comprise elevated features like fins to increase surface area and accelerate process of phase changes between the liquid phase and the gas phase of the coolant. Further, any of the foregoing interior surfaces or exterior surfaces could coated with a microporous layer to enhance thermal dissipation. For example, a microporous layer may comprise a powdered carbon in a matrix, such as an adhesive, polymeric or plastic matrix, or another coating (e.g., in an interior 60 of the evaporator stack) that promotes boiling and nucleation of the coolant (e.g., refrigerant) used.

In an alternate embodiment, the fins 74 on the exterior of the enclosure can be optimized as pins, fins 74 or other protrusions and could assume appropriate geometrical shapes. The electronic assembly may add an optional fan or fans to achieve required movement of air around the finned exterior or outer surface of the enclosure.

In some configurations, semiconductor device comprises a substrate or another printed circuit board assembly (PCBA) where one or more semiconductor chipsets are directly bonded to a thermal clad metallic heat spreader and that would also be air-cooled to augment the heat transfer from the bottom surface of the power semiconductor chipsets.

Although the evaporator stack is generally focused on heat transfer from the semiconductor devices in an electronic assembly, the same concept could be used to cool other heat-generating components in the electronic assembly or on any circuit board therein. For example, an optional evaporator stack can be placed at a location on high-current carrying traces on circuit board or on a connector interface. Accordingly, a single electronics assembly could have many evaporator stacks that interface with corresponding openings in one or more respective condensation containers, where multiple evaporator stacks may be serviced by corresponding openings in a single condensation container or multiple condensation containers.

Having described the preferred embodiment, it will become apparent that various modifications can be made without departing from the scope of the invention as defined in the accompanying claims.

The following is claimed:

1. An electronic assembly comprising:
   a plurality of heat-generating semiconductor devices, each of the heat-generating semiconductor devices having first side and a second side opposite the first side;
   a set of evaporator stacks, each of the evaporator stacks comprising a hollow body with a floor at a first end and an outlet at a second end opposite the first end, where the second end is associated with an upper portion that is substantially cylindrical, each said evaporator stack overlying the first side of a corresponding one of the semiconductor devices, wherein each said evaporator stack or its floor is adapted to convert a liquid-phase of a coolant into a gas-phase of the coolant;
   a condensation container or condensation chamber with respective openings in communication with the corresponding outlets of the evaporator stacks, the condensation container or condensation chamber adapted to receive a gas-phase or vapor-phase of a coolant and to cool or convert the received gas-phase of the coolant into a liquid phase to replenish liquid for interaction with the floors of the evaporator stacks; and
   a circuit board; and wherein each of the evaporator stacks has radially extending metal tabs that can be connected or soldered to the circuit board for surface mounting of each said evaporator stack.

2. The electronic assembly according to claim 1 wherein the hollow body of each of the evaporator stacks has a lower portion and the upper portion, the lower portion being substantially cylindrical or semi-conical.

3. The electronic assembly according to claim 1 wherein the hollow body of each of the evaporator stacks has a lower portion and the upper portion, the lower portion having sloped walls, wherein the walls are sloped radially outward and downward toward the floor.

4. The electronic assembly according to claim 3 wherein the upper portion has an outer surface that engages the opening of the condensation container.

5. The electronic assembly according to claim 1 wherein the floor of each of the evaporator stacks overlies the first side of the corresponding one of the semiconductor devices.

6. The electronic assembly according to claim 1 wherein each of the evaporator stacks is composed of a metal or an alloy.

7. The electronic assembly according to claim 1 wherein the first side of each of the semiconductor devices is bonded to the first end at a bottom side of a respective one of the evaporator stacks.

8. The electronic assembly according to claim 1 wherein a metallic pad on the first side of each of semiconductor devices is soldered to the first end of a respective one of the evaporator stack.

9. The electronic assembly according to claim 1 wherein the first side of each of the semiconductor devices has a thermal interface material between the first side of each of the semiconductor devices and the first end of a corresponding one of the evaporator stacks.

10. The electronic assembly according to claim 1 wherein the floor of an interior of each of the evaporator stacks comprises a series or raised protrusions for cooling.

11. The electronic assembly according to claim 1 wherein the floor of an interior of each of the evaporator stacks comprises a set of ridges, fins, substantially cylindrical protrusions, or elevated patterns of islands extending above a lower background surface.

12. The electronic assembly according to claim 1 further comprising:
a lower heat sink thermally coupled to the second side of the semiconductor devices via a circuit board with a metal base layer adjoining or facing the lower heat sink.

13. The electronic assembly according to claim 12 wherein the semiconductor device is cooled simultaneously by the lower heat sink that is adapted to transfer thermal energy to the ambient air and by the evaporator stack that facilitates a phase-change between a liquid phase and a gas phase.

14. The electronic assembly according to claim 12 further comprising an upper heat sink that is thermal communication with the semiconductor device via a lid of the condensation container.

15. The electronic assembly according to claim 14 wherein the upper heat sink and lower heat sink comprise a first enclosure portion and a second enclosure portion, respectively, wherein the first enclosure portion is secured to the second enclosure portion via one or more fasteners or retainers.

16. The electronic assembly according to claim 1 wherein the condensation container comprises a sloped floor that allows condensation of the coolant that forms on interior surfaces of the condensation container to drain back to one or more of the evaporator stacks by gravity.

17. The electronic assembly according to claim 16 wherein the coolant forms on the interior surfaces when a liquid phase changes back to a gas phase.

18. The electronic assembly according to claim 1 wherein the phase-change of the coolant transitions to a gas phase in one or more of the evaporator stacks, transitions to a liquid phase in the condensation container, and returns by gravity to the evaporator stack in liquid phase.

19. The electronic assembly according to claim 18 wherein coolant is circulated by phase-change of the coolant, the sloped floor of the condensation container, and without any pump.

20. An electronic assembly comprising:
a plurality of heat-generating components, each of the heat-generating components having first side and a second side opposite the first side;
a set of evaporator stacks, each of the evaporator stacks comprising a hollow body with a floor at a first end and an outlet at a second end opposite the first end, where the second end is associated with an upper portion that is substantially cylindrical, each said evaporator stack overlying the first side of a corresponding one of the components, wherein the evaporator stack or its floor is adapted to convert a liquid-phase of a coolant into a gas-phase of the coolant;
a condensation container or condensation chamber with respective openings in communication with the corresponding outlets of the evaporator stacks, the condensation container or condensation chamber adapted to receive a gas-phase or vapor-phase of a coolant and to cool or convert the received gas-phase of the coolant into a liquid phase to replenish liquid for interaction with the floors of the evaporator stacks; and
a circuit board; and wherein each of the evaporator stacks has radially extending metal tabs that can be connected or soldered to the circuit board for surface mounting of each said evaporator stack.

21. An electronic assembly comprising:
a heat-generating semiconductor device having first side and a second side opposite the first side;
a circuit board having a metallic trace, the semiconductor device having an output terminal connected to the metallic trace;
at least one evaporator stack comprising a hollow body with a floor at a first end and an outlet at a second end opposite the first end, where the second end is associated with an upper portion that is substantially cylindrical, the at least one evaporator stack overlying a portion of the metallic trace, wherein the at least one evaporator stack or its floor is adapted to convert a liquid-phase of a coolant into a gas-phase of the coolant, wherein the at least one evaporator stack has radially extending metal tabs that can be connected or soldered to the circuit board for surface mounting of the at least one evaporator stack; and
a condensation container with an opening in communication with the outlet of the at least one evaporator stack, the condensation container adapted to receive a gas-phase or vapor-phase of a coolant and to cool or convert the received gas-phase of the coolant into a liquid phase to replenish liquid for interaction with the floor of the at least one evaporator stack.

22. The electronic assembly according to claim 21 wherein the portion of the metallic trace comprises a metallic pad near the semiconductor device to provide a target clearance between an outer package of the semiconductor device and the radial extent of the at least one evaporator stack from a substantially vertical axis of the at least one evaporator stack.

23. The electronic assembly according to claim 21 wherein the target clearance is based on manufacturing tolerance and coefficient of thermal expansion.

24. The electronic assembly according to claim 21 wherein the target clearance is based on equidistant metallic trace distance or length from the at least one evaporator stack to a plurality of semiconductor devices comprising the heat-generating semiconductor device.

25. The electronic assembly according to claim 24 wherein the semiconductor devices comprise a low-side transistor and a high-side transistor of one output phase of the electronic assembly, wherein the electronic assembly comprises an inverter.

* * * * *